US008780244B2

(12) United States Patent
Wada et al.

(10) Patent No.: US 8,780,244 B2
(45) Date of Patent: Jul. 15, 2014

(54) IMAGE PICKUP APPARATUS AND IMAGE PICKUP SYSTEM

(71) Applicant: Canon Kabushiki Kaisha, Tokyo (JP)

(72) Inventors: Yoichi Wada, Yokohama (JP); Masahiro Kobayashi, Tokyo (JP); Michiko Johnson, Machida (JP); Hiromasa Tsuboi, Koshigaya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/742,142

(22) Filed: Jan. 15, 2013

(65) Prior Publication Data

US 2013/0182159 A1 Jul. 18, 2013

(30) Foreign Application Priority Data

Jan. 18, 2012 (JP) .................................. 2012-008202

(51) Int. Cl.
*H04N 5/335* (2011.01)
(52) U.S. Cl.
USPC .......................................................... 348/294
(58) Field of Classification Search
CPC ..... H04N 5/369; H04N 5/3696; H04N 5/374; H04N 5/3741; H04N 5/3745
USPC .......................................................... 348/294
See application file for complete search history.

(56) References Cited

U.S. PATENT DOCUMENTS

| 5,721,422 | A  | * | 2/1998 | Bird ............................ 250/208.1 |
| 7,663,680 | B2 | * | 2/2010 | Hashimoto et al. ........... 348/301 |
| 8,111,311 | B2 | * | 2/2012 | Iwane ............................ 348/294 |
| 2006/0192263 | A1 | * | 8/2006 | Inagaki et al. ................ 257/443 |
| 2009/0101914 | A1 | * | 4/2009 | Hirotsu et al. .................. 257/72 |
| 2013/0020621 | A1 | * | 1/2013 | Inagaki et al. ................ 257/292 |

FOREIGN PATENT DOCUMENTS

| JP | 10-256521 A | 9/1998 |
| JP | 2001-250931 A | 9/2001 |

* cited by examiner

*Primary Examiner* — James Hannett
(74) *Attorney, Agent, or Firm* — Canon USA, Inc. IP Division

(57) ABSTRACT

An image pickup apparatus according to one or more embodiments includes a power line and first through fourth photodiodes. The first, second, and third photodiodes are arranged along a first direction so that the first photodiode is adjacent to the second photodiode, and the second photodiode is adjacent to the third photodiode. The power line includes a first conductor disposed along the first direction and a second conductor disposed along a second direction that intersects the first direction. The second conductor is disposed on a region between the second and third photodiodes. First and second transistors corresponding to the first and second photodiode, respectively, are connected to the power line. The fourth photodiode is disposed adjacent to the second photodiode in the second direction. A third transistor corresponding to the fourth photodiode is connected to the power line.

13 Claims, 8 Drawing Sheets

US 8,780,244 B2

IMAGE PICKUP APPARATUS AND IMAGE PICKUP SYSTEM

BACKGROUND OF THE INVENTION

1. Field of the Invention

One disclosed aspect of the embodiments relates to an image pickup apparatus and an image pickup system.

2. Description of the Related Art

An image pickup apparatus including a plurality of photoelectric conversion units arranged in a two-dimensional array is used in, for example, digital cameras and digital camcorders.

A technology for detecting a focus state using a phase difference method has been used in image pickup apparatuses. Japanese Patent Laid-Open No. 2001-250931 describes an image pickup apparatus including two photoelectric conversion units under each of a plurality of microlens in order to receive light rays separated from a light ray collected by the microlens. The photoelectric conversion units are configured so as to receive light rays from different pupil planes of an image-capturing lens.

As illustrated in FIG. 8 of Japanese Patent Laid-Open No. 2001-250931, in the image pickup apparatus, each of two photoelectric conversion units disposed under a microlens has a transistor that reads a signal. More specifically, three transistors B07, B09, and B11 are disposed for a first photoelectric conversion unit PD1. In addition, three transistors B08, B10, and B12 are disposed for a second photoelectric conversion unit PD2. Furthermore, Japanese Patent Laid-Open No. 2001-250931 describes that any light shielding member is not disposed between the photoelectric conversion units disposed under a microlens.

Still furthermore, as the number of pixels of an image pickup apparatus increases in order to capture a high-resolution image, the area or the aperture ratio of the photoelectric conversion unit (e.g., a photodiode) is reduced. To solve such a problem, Japanese Patent Laid-Open No. 10-256521 describes a technology for sharing an electrical component by a plurality of pixels.

SUMMARY OF THE INVENTION

According to an embodiment, an image pickup apparatus includes a plurality of photoelectric conversion units and a power supply line configured to supply a power supply voltage. The plurality of photoelectric conversion units include a first photoelectric conversion unit and a second photoelectric conversion unit that receive incident light in a first wavelength range and a third photoelectric conversion unit that receive incident light in a second wavelength range. The first photoelectric conversion unit, the second photoelectric conversion unit, and the third photoelectric conversion unit are arranged along a first direction so that the first photoelectric conversion unit is adjacent to the second photoelectric conversion unit, and the second photoelectric conversion unit is adjacent to the third photoelectric conversion unit. The power supply line includes a first conductive member disposed along the first direction and a second conductive member disposed along a second direction that intersects the first direction. The second conductive member is disposed between the second photoelectric conversion unit and the third photoelectric conversion unit. A first transistor that reads a signal output from the first photoelectric conversion unit and a second transistor that reads a signal output from the second photoelectric conversion unit are electrically connected to the power supply line. The plurality of photoelectric conversion units include a fourth photoelectric conversion unit disposed adjacent to the second photoelectric conversion unit in the second direction, and a third transistor that reads a signal output from the fourth photoelectric conversion unit is connected to the power supply line.

According to another embodiment, an image pickup apparatus includes a plurality of photoelectric conversion units and a power supply line configured to supply a power supply voltage. The plurality of photoelectric conversion units include a first photoelectric conversion unit and a second photoelectric conversion unit disposed under a first lens and a third photoelectric conversion unit disposed under a second lens. The first photoelectric conversion unit, the second photoelectric conversion unit, and the third photoelectric conversion unit are arranged along a first direction so that the first photoelectric conversion unit is adjacent to the second photoelectric conversion unit, and the second photoelectric conversion unit is adjacent to the third photoelectric conversion unit. The power supply line includes a first conductive member disposed along the first direction and the second conductive member disposed along a second direction that intersects the first direction. The second conductive member is disposed between the second photoelectric conversion unit and the third photoelectric conversion unit. A first transistor that reads a signal output from the first photoelectric conversion unit and a second transistor that reads a signal output from the second photoelectric conversion unit are electrically connected to the power supply line. The plurality of photoelectric conversion units include a fourth photoelectric conversion unit disposed adjacent to the second photoelectric conversion unit in the second direction, and a third transistor that reads a signal output from the fourth photoelectric conversion unit is connected to the power supply line.

According to still another embodiment, an image pickup system includes one of the above-described image pickup apparatuses and a signal processing unit configured to process a signal output from the image pickup apparatus.

Further features of the disclosure will become apparent from the following description of exemplary embodiments with reference to the attached drawings.

DESCRIPTION OF THE EMBODIMENTS

Figure 1A:
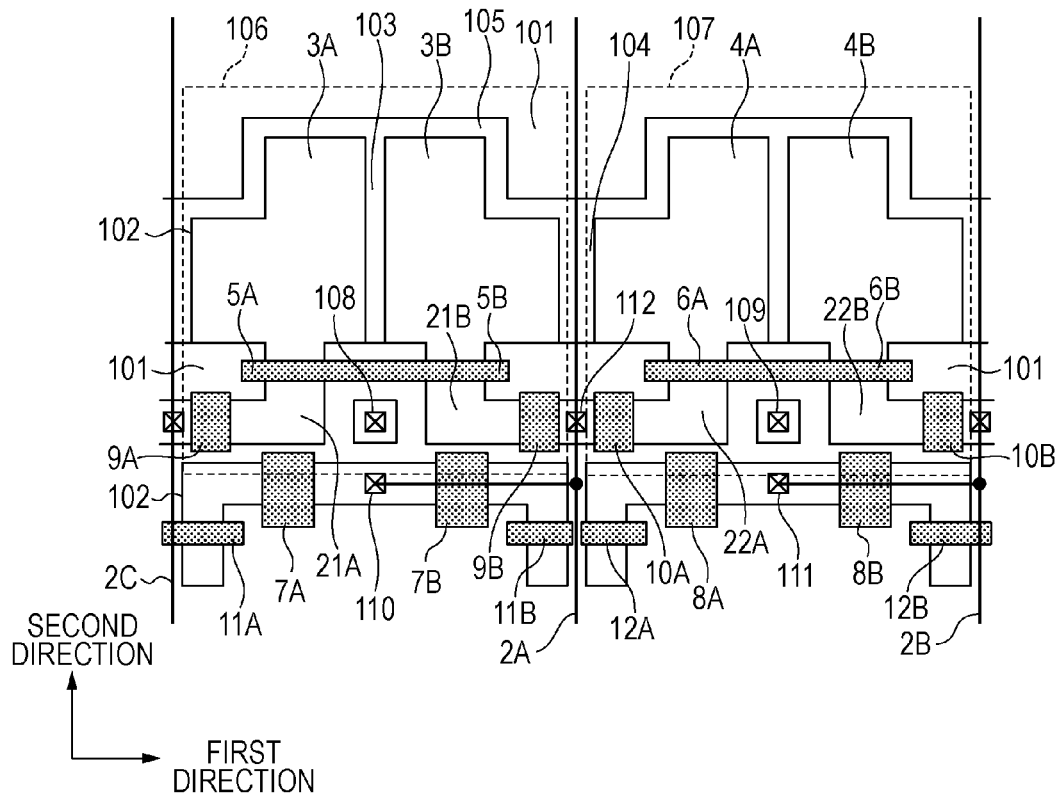
FIG. 1A is a schematic illustration of a planar layout of an image pickup apparatus according to a first exemplary embodiment.

An image pickup apparatus according to one or more embodiments can reduce a difference between the characteristics of transistors that read signals. The embodiments can provide a high-quality image. In addition, some of the embodiments can increase the accuracy of focus detection.

It has been noted that the accuracy of detecting a focus state may be degraded if the characteristics of transistors that read signals from the photoelectric conversion units differ from each other. For example, if, in Japanese Patent Laid-Open No. 2001-250931, the characteristic of a transistor B09 differs from that of a transistor B10 illustrated in FIG. 8, the outputs of the transistors B09 and B10 may differ from each other although the amounts of charge stored in the two photoelectric conversion units are the same.

It has been further noted that in an image pickup apparatus for two or more colors, the quality of an image may be degraded when the photoelectric conversion units that receive light of the same color incident thereon are disposed adjacent to each other and if the characteristics of the transistors differ from each other. This is because if the photoelectric conversion units for the same color are disposed adjacent to each other, the same amount of light is generally incident on each of the photoelectric conversion units. If, at that time, the characteristics of the transistors differ from each other, the intensities of signals output from the transistors differ from each other although almost the same amount of light is incident on each of the photoelectric conversion units.

It was discovered that the difference in the characteristics of the transistors was caused by power supply lines that supply a power supply voltage to the transistors. More specifically, if two transistors are connected to different power supply lines, a difference in the characteristics of the transistors appears. This is because it is likely that the supplied voltages differ from each other due to a voltage drop occurring in the power supply lines.

Japanese Patent Laid-Open No. 2001-250931 does not describe power supply lines disposed in a column direction. If a light shielding member is not disposed between two photoelectric conversion units, a power supply line extending in the column direction is disposed between different microlenses or different photoelectric conversion units for different colors. Therefore, according to the comparative example indicated by Japanese Patent Laid-Open No. 2001-250931, transistors that read signals from two photoelectric conversion units disposed under one microlens can be connected to different power supply lines. That is, the characteristics of the two transistors may differ from each other. In addition, Japanese Patent Laid-Open No. 10-256521 does not discuss any specific layout of wire line.

One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

First Group of Embodiments

A first group of embodiments is described next with reference to FIGS. 1A and 1B. For convenience of description, in FIGS. 1A and 1B, only wire lines related to the first group of embodiments are illustrated. In reality, to operate the image pickup apparatus, a plurality of wire lines are further disposed. For example, gate control lines of transistors and a signal output line provided to each of rows of pixels are disposed.

According to the first group of embodiments, the image pickup apparatus includes a plurality of photoelectric conversion units arranged in a two-dimensional array. A region having the plurality of photoelectric conversion units disposed therein serves as an image sensing area. For example, a photodiode (hereinafter simply referred to as a "PD") is used as the photoelectric conversion unit. A PD includes an N-type (first conductive type) semiconductor region and a P-type (second conductive type) semiconductor region that forms a PN junction together with the N-type semiconductor region. For example, a P-type well serves as a P-type semiconductor region. Such photoelectric conversion units are arranged along a first direction. In FIGS. 1A and 1B, the first direction is the right-left direction of the page. A potential barrier is formed between the photoelectric conversion units. In addition, an isolation unit may electrically insulate the photoelectric conversion unit from an element, such as a transistor.

Note that for example, the photoelectric conversion units may be arranged along the first direction so that the median points of the photoelectric conversion units are in the same straight line or the median points are staggered.

Each of the photoelectric conversion units has a wavelength selection unit, such as a color filter, disposed therein. For example, a color filter that allows light in a red wavelength range to pass therethrough is disposed on the photoelectric conversion unit and, thus, the light in a red wavelength range is incident on the photoelectric conversion unit. The plurality of the photoelectric conversion units arranged along the first direction include a plurality of the photoelectric conversion units that receives light in a first wavelength range (e.g., a red wavelength range) incident thereon and a plurality of the photoelectric conversion units that receives light in a second wavelength range (e.g., a green wavelength range) incident thereon. Sets of the photoelectric conversion units for a plurality of colors are alternately and repeatedly arranged. In addition, at least two photoelectric conversion units that receive light of the same color are disposed adjacent to each other. For example, two photoelectric conversion units that receive red light incident thereon are disposed adjacent to each other, and two photoelectric conversion units that receive green light incident thereon are disposed next to the photoelectric conversion units that receive red light. This set of the four photoelectric conversion units is repeatedly arranged. At that time, the number of consecutive photoelectric conversion units is not limited to two. For example, two consecutive red photoelectric conversion units may be disposed, one green photoelectric conversion unit may be disposed next to the red photoelectric conversion units, and this set of the three photoelectric conversion units may be repeatedly arranged. As described above, it is only required that at least two photoelectric conversion units for the same color are disposed adjacent to each other.

As used herein, a plurality of photoelectric conversion units that receive light in the same color wavelength range incident thereon are referred to as "photoelectric conversion units for the same color". In addition, a plurality of photoelectric conversion units that receive light rays in different color wavelength ranges incident thereon are referred to as "photoelectric conversion units for different colors".

As used herein, among the photoelectric conversion units arranged in a two-dimensional array, a set of the photoelectric conversion units that output signals read in parallel is referred to as a "row". The plurality of photoelectric conversion units included in each of rows may be arranged along the first direction. The signals may be read from a plurality of the photoelectric conversion units included in a row in parallel. Alternatively, the signals may be read from a plurality of the photoelectric conversion units included in a plurality of rows in parallel. In addition, in order to read a signal generated by each of photoelectric conversion units, transistors are disposed for each of the photoelectric conversion units. The transistors that read a signal from the photoelectric conversion unit form a pixel circuit. That is, the transistors that read a signal from the photoelectric conversion unit form a readout circuit for each of the photoelectric conversion units in an image sensing area. More specifically, the transistors that read a signal output from a photoelectric conversion unit are, for example, an amplifier transistor, a reset transistor, and a selection transistor. The photoelectric conversion unit and transistors that read a signal output from the photoelectric conversion unit may form a pixel. That is, a pixel includes a photoelectric conversion unit and a pixel circuit.

A first aspect of the embodiments is characterized in that two corresponding transistors for reading signals output from two photoelectric conversion unit for the same color arranged adjacent to each other are electrically connected to the same power supply line. Note that the term "two corresponding transistors" refers to two transistors having the same function in the readout circuit. For example, the drains of the two amplifier transistors are electrically connected to the same power supply line.

In addition, the power supply line includes a first conductive member extending in the first direction and a second conductive member extending in a second direction that intersects the first direction. As illustrated in FIGS. 1A and 1B, the second direction is an up-down direction of the page.

The second conductive member is disposed between the two photoelectric conversion units for different colors. The second conductive member extends across at least a plurality of rows. In this manner, transistors corresponding to the photoelectric conversion units included in the plurality of rows are connected to the same power supply line. That is, the transistors corresponding to a plurality of the photoelectric conversion units included in a pixel column are connected to the same power supply line. For example, as illustrated in FIGS. 1A and 1B, a power supply voltage is supplied from the same power supply line to an amplifier transistor for reading a signal output from a PD 3B and an amplifier transistor for reading a signal output from a PD (not illustrated) disposed adjacent to the PD 3B in the second direction. Preferably, the second conductive member may extend all across the image sensing area. In such a case, the transistors corresponding to all of the photoelectric conversion units arranged along the second direction, that is, the transistors corresponding to all of the photoelectric conversion units included in one pixel column may be connected to the same power supply line.

Since two photoelectric conversion units for the same color are arranged adjacent to each other along the first direction, two transistors for reading signals output from the photoelectric conversion units are arranged along the first direction. Since the power supply line includes the first conductive member extending in the first direction, two transistors corresponding to the two photoelectric conversion units for the same color may be connected to the same power supply line.

Preferably, the first conductive member and the second conductive member are disposed in different wiring layers. However, the first conductive member and the second conductive member may be included in the same wiring layer, depending on a positional relationship with other wire lines. If the first conductive member and the second conductive member are disposed in different wiring layers, the first conductive member and the second conductive member are connected to each other using a via plug. The first conductive member is extended from a position at which the via plug is disposed in the first direction. At that time, it is desirable that the first conductive member be electrically connected to a transistor using a contact plug. However, depending on a layout, the transistor may be connected to the second conductive member using a contact plug.

If two transistors are connected to different power supply lines, the power supply voltages supplied to the two transistors may differ from each other. However, according to the configuration illustrated in FIGS. 1A and 1B, the power supply voltage is supplied from the same power supply line to the transistors that read signals from the photoelectric conversion units for the same color. Thus, a difference between the characteristics of the transistors for reading signals may be reduced or may be completely eliminated.

By reducing a difference between the characteristics of the neighboring transistors for reading signals from two photoelectric conversion units for the same color, the quality of an image may be increased. This is because if signals output from two photoelectric conversion units for the same color differ from each other when the same amount of light is incident on each of the two photoelectric conversion units, noise becomes noticeable. However, if a difference between the characteristics of the transistors for the same color is small, such noticeable noise may be reduced.

In particular, if the amplifier transistors are connected to the same power supply line, the effect is noticeable. This is because an electrical current flows in the amplifier transistor when the amplifier transistor operates and, therefore, a variation in the power supply voltage in accordance with a variation in the parasitic resistance of the power supply line becomes noticeable.

In addition, according to the present group of embodiments, a lens that collects light incident on the photoelectric conversion unit may be provided in the image pickup apparatus. A plurality of lenses may be disposed in an array. A lens may be provided for each of the photoelectric conversion units. Alternatively, a lens may be provided for two photoelectric conversion units for the same color that are disposed adjacent to each other. The lens collects or focuses parallel light rays incident thereon to a point. The lens is in the form of a microlens made of, for example, an organic material.

Exemplary embodiments of the present group of embodiments are described below with reference to the accompanying drawings. Note that in the exemplary embodiments, the first conductive type is an N type, and the second conductive type is a P type. Electrons are accumulated in the photoelectric conversion unit as signal charges. It should be appreciated that exemplary embodiments in which the first conductive type is a P type and the second conductive type is an N type are also embraced within the scope of the embodiments. In such exemplary embodiments, holes are accumulated in the photoelectric conversion unit as signal charges. Since only the conductive types are exchanged in these exemplary embodiments, descriptions of the exemplary embodiments are not repeated. In addition, an image pickup apparatus and an image pickup system including a signal processing unit that processes a signal output from the image pickup apparatus are also embraced within the scope of the embodiments. In such a case, an existing signal processing unit may be used as the signal processing unit.

First Exemplary Embodiment

A first exemplary embodiment is described below with reference to the accompanying drawings. In the following description, the same reference numbers are assigned to similar elements of the photoelectric conversion units for the same color, but are suffixed by different alphabetic characters. For example, PDs for the same color are designated as "PD 3A" and "PD 3B". Amplifier transistors that amplify signals output from the photoelectric conversion units for the same color are designated as "amplifier transistors 7A and 7B". This applies to all of the following exemplary embodiments.

FIG. 1A is a schematic illustration of a planar layout of an image pickup apparatus according to the first exemplary embodiment. According to the present exemplary embodiment, the image pickup apparatus includes a semiconductor substrate having a field region 101 and an active region 102. For example, the semiconductor substrate is made of silicon. The field region 101 is formed as an insulating isolation region, such as an STI or LOCOS region. For example, the insulator is formed from a silicon dioxide film. The active region 102 has a semiconductor region disposed therein. The semiconductor region forms a photoelectric conversion unit and a transistor.

The active region 102 has a PD 3A, a PD 3B, a PD 4A, and a PD 4B disposed therein. Each of the PDs includes an N-type semiconductor region. The N-type semiconductor region and a P-type semiconductor region that form a PN junction together with the N-type semiconductor region form the PD. For example, the P-type semiconductor region is formed as a dark current blocking layer disposed on the surface, a semiconductor region that forms a potential barrier, a dark current blocking layer disposed so as to be adjacent to the insulating isolation region, a channel stop layer, a well, or the semiconductor substrate. Electrons serving as signal charges are accumulated in the N-type semiconductor region that forms the PD.

The PD 3A, the PD 3B, the PD 4A, and the PD 4B are arranged along the first direction. According to the present exemplary embodiment, a plurality of the photoelectric conversion units arranged along the first direction are arranged so that the median points of the photoelectric conversion units are in the same straight line. Note that the median points of the photoelectric conversion units may be staggered.

A red color filter 106 is disposed on the PD 3A and the PD 3B. A green color filter 107 is disposed on the PD 4A and the PD 4B. As illustrated in FIGS. 1A and 1B, two PDs for the same color are disposed adjacent to each other. The color filters 106 and 107 allow light rays having wavelengths in different wavelength ranges to pass therethrough. In this manner, according to the present exemplary embodiment, the image pickup apparatus includes the wavelength selection units for two or more colors. A light ray in the wavelength range selected by the color filter 106 is incident on the PDs 3A and 3B. A light ray in the wavelength range selected by the color filter 107 is incident on the PDs 4A and 4B. Although not illustrated in FIG. 1A, the arrangement of the PDs 3A, 3B, 4A, and 4B are repeatedly disposed along the first direction.

According to the present exemplary embodiment, the plurality of PDs arranged along the first direction serve as the photoelectric conversion units in a row. That is, the PD 3A, the PD 3B, the PD 4A, and the PD 4B are included in the same row. Although not illustrated in FIG. 1A, a plurality of photoelectric conversion units included in the image pickup apparatus according to the present exemplary embodiment may be disposed so as to form a plurality of rows.

According to the present exemplary embodiment, a potential barrier 103 may be formed from a P-type semiconductor region between the PD 3A and the PD 3B for the same color. In addition, a potential barrier 104 may be formed from a P-type semiconductor region between the PD 3B and the PD 4A for different colors. The length of the P-type semiconductor region that forms the potential barrier 104 in the first direction is longer than the length of the P-type semiconductor region that forms the potential barrier 103 in the first direction. An end of the P-type semiconductor region serves as a PN junction plane. That is, a distance between the N-type semiconductor region included in the PD 3B and the N-type semiconductor region included in the PD 4A is longer than a distance between the N-type semiconductor region included in the PD 3A and the N-type semiconductor region included in the PD 3B.

A potential barrier is formed from a region in which the potential for the signal charge accumulated in the photoelectric conversion unit is higher than the potential of the signal charges of the photoelectric conversion unit. For example, when the photoelectric conversion unit is formed from a PD including a PN junction and if the signal charges are electrons, the potential barrier is a region in which the potential for an electron is higher than the potential of the N-type semiconductor region included in the PD. Alternatively, if the signal charges are holes, the potential barrier is a region in which the potential for a hole is higher than the potential of the P-type semiconductor region included in the PD.

The potential barrier may be formed from an insulating isolation region, such as a STI, LOCOS, or MESA region. Since the band gap of an insulating material is wider than that of a semiconductor, the insulating material may function as the potential barrier for a carrier in the semiconductor (i.e., for both an electron and a hole). Alternatively, if the signal charge is an electron, the potential barrier may be formed from a P-type semiconductor region. Still alternatively, if the signal charge is a hole, the potential barrier may be formed from an N-type semiconductor region. Yet still alternatively, to form the potential barrier, an electrode may be disposed on the semiconductor substrate, and the potential barrier may be formed by a voltage supplied to the electrode. As the voltage supplied to the electrode is decreased, the potential for a hole increases. In contrast, as the voltage supplied to the electrode is increased, the potential for a hole increases. As used herein, i.e., in all of the following exemplary embodiments, the words "potential barrier is disposed" include at least a condition that the potential barrier is formed using any one of the above-described configurations or a condition that the potential barrier is possibly formed using any one of the above-described configurations.

Note that a potential barrier between two photoelectric conversion units is a region sandwiched by the N-type semiconductor regions of the photoelectric conversion units. In addition, the distance from the potential barrier is defined as a distance from an end of an insulating material that forms the potential barrier or a distance from an end of a P-type semiconductor region that forms the potential barrier.

A P-type semiconductor region 105 is disposed between the insulating isolation region that forms the field region 101 and the PD. The P-type semiconductor region 105 serves as a dark current blocking layer that reduces a dark current that is generated on the boundary face of the insulating material and that flows into the PD.

Floating diffusion regions (hereinafter simply referred to as "FDs") 21A, 21B, 22A, and 22B that receive electrical charge from the PD are disposed in the active region 102. In addition, transfer transistors 5A, 5B, 6A, and 6B that transfer the electrical charge of the PD to an FD region are provided. The FD region is connected to amplifier transistors 7A, 7B, 8A, and 8B using wire lines (not illustrated). Each of the amplifier transistors functions as an amplifier unit that amplifies a signal generated by the PD. In addition, reset transistors 9A, 9B, 10A, and 10B and selection transistors 11A, 11B, 12A, and 12B are disposed. Each of the reset transistors resets an input node of the amplifier transistor to a predetermined voltage. Each of the selection transistors controls an electrical connection between the source of the amplifier transistor and a signal output line (not illustrated). The signal output line is disposed in the wiring layer that includes power supply lines 2A to 2C among a plurality of the wiring layers. Each of the transistors includes semiconductor regions that form the source and the drain. The transistor further includes a gate electrode formed from, for example, polysilicon.

According to the present exemplary embodiment, well contact plugs 108 and 109 that supply a voltage to the P-type semiconductor region forming the PD are disposed. The well contact plugs 108 and 109 are formed of a conductive material, such as tungsten. The well contact plug 108 is disposed so as to be closer to the potential barrier 103 disposed between the PDs 3A and 3B for the same color than to the potential barrier 104 between the PDs 3B and 4A for different colors. In addition, the well contact plug 108 is disposed in a region that is an extension of the P-type semiconductor region that forms the potential barrier 103 in the second direction. That is, the well contact plug 108 is disposed outside the potential barrier 103. Furthermore, as illustrated in FIG. 1A, the well contact plug 108 may be disposed in the middle of the two photoelectric conversion units.

Still furthermore, the well contact plug 109 is also disposed between two PDs for the same color. In this manner, according to the present exemplary embodiment, a well contact plug is not disposed between the photoelectric conversion units for different colors. However, in order to obtain a predetermined electrical characteristic, a well contact plug may be disposed between the photoelectric conversion units for different colors.

According to the present exemplary embodiment, an insulating isolation region is disposed between the well contact plug 108 and the potential barrier 103 formed between the photoelectric conversion units for the same color. Due to the presence of the insulating isolation region, a dark current that is generated by the well contact plug 108 and that reaches the photoelectric conversion unit may be reduced.

According to the present exemplary embodiment, the drains of the amplifier transistors 7A and 7B are formed from a shared semiconductor region. In addition, the drains of the amplifier transistors 7A and 7B are connected to the power supply line 2A via a shared contact plug 110. The drains of the amplifier transistors 8A and 8B are formed from a shared semiconductor region. In addition, the drains of the amplifier transistors 8A and 8B are connected to the power supply line 2B via a shared contact plug 111.

The drain of the reset transistor 9A is connected to the power supply line 2C. In contrast, the drains of the reset transistor 9B and the reset transistor 10A are formed from a shared semiconductor region. In addition, the drains of the reset transistor 9B and the reset transistor 10A are connected to the power supply line 2A via the shared contact plug 111.

Each of the power supply lines 2A to 2C that supply the power supply voltage includes the first conductive member extending in the first direction and the second conductive member extending in the second direction. The first conductive member is electrically connected to the second conductive member. The first conductive member and the second conductive member may be part of a conductive pattern. Although only one pixel row is illustrated in the drawing, the second conductive member is continuously disposed in a plurality of rows. That is, a power supply voltage is supplied from the same power supply line to a plurality of transistors that read signals generated in the photoelectric conversion units arranged along the second direction. Preferably, each of the power supply lines 2A to 2C is disposed between the photoelectric conversion units for different colors in the row. Note that at that time, a combination of the colors may vary for each of the rows.

As illustrated in FIG. 1A, the second conductive member is disposed between the photoelectric conversion units for different colors. For example, the second conductive member included in the power supply line 2A is disposed between the PD 3B and the PD 4A. The second conductive member may partially overlap the PD 3B or the PD 4A.

The first conductive member extends from a region between the photoelectric conversion units for different colors to a region between the photoelectric conversion units for the same color. For example, the first conductive member included in the power supply line 2A extends from a region between the PD 3B and the PD 4A to a region between the PD 3A and the PD 3B. In this manner, the semiconductor region that forms the drain of the amplifier transistor disposed between the PD 3A and the PD 3B is electrically connected to the power supply line 2A via the shared contact plug 110. That is, two amplifier transistors 7A and 7B corresponding to the two photoelectric conversion units for the same color are electrically connected to the power supply line 2A.

Figure 1B:
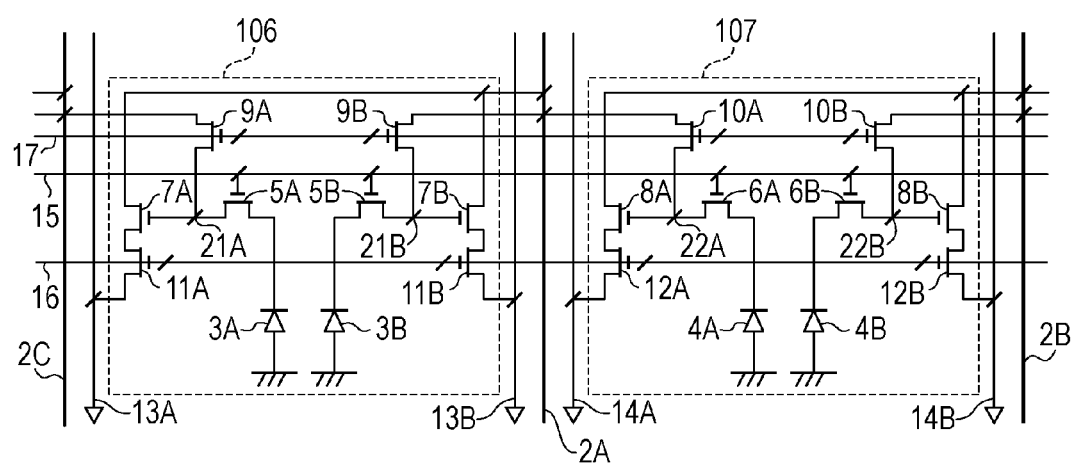
FIG. 1B is an equivalent circuit diagram of the image pickup apparatus.

FIG. 1B is an equivalent circuit diagram of the image pickup apparatus according to the present exemplary embodiment. In FIG. 1B, the following components are illustrated: the PDs 3A, 3B, 4A, and 4B, the transfer transistors 5A, 5B, 6A, and 6B, FD nodes 21A, 21B, 22A, and 22B, the amplifier transistors 7A, 7B, 8A, and 8B, the reset transistors 9A, 9B, 10A, and 10B, and the selection transistors 11A, 11B, 12A, and 12B. In addition, signal output lines 13A, 13B, 14A, and 14B that output signals generated by the PDs are illustrated. The transfer transistors 5A, 5B, 6A, and 6B are controlled by a drive pulse pTX supplied to a control line 15. The reset transistors 9A, 9B, 10A, and 10B are controlled by a drive pulse pRES supplied to a control line 17. The selection transistors 11A, 11B, 12A, and 12B are controlled by a drive pulse pSEL supplied to a control line 16.

As illustrated in FIG. 1B, the drains of the amplifier transistors 7A and 7B corresponding to the PDs 3A and 3B for the same color, respectively, are electrically connected to the power supply line 2A. In addition, the drains of the amplifier transistors 8A and 8B corresponding to the PDs 4A and 4B for the same color, respectively, are electrically connected to the power supply line 2B.

In contrast, the drains of the reset transistors 9A and 9B corresponding to the PDs 3A and 3B for the same color, respectively, are connected to different power supply lines. That is, the drain of the reset transistor 9A is electrically connected to the power supply line 2C, and the drain of the reset transistor 9B is electrically connected to the power supply line 2A.

Note that for convenience of description, in FIG. 1B, only three power supply lines 2A to 2C are illustrated. The three power supply lines 2A to 2C may be wire lines that supply the same power supply voltages.

Figure 8:
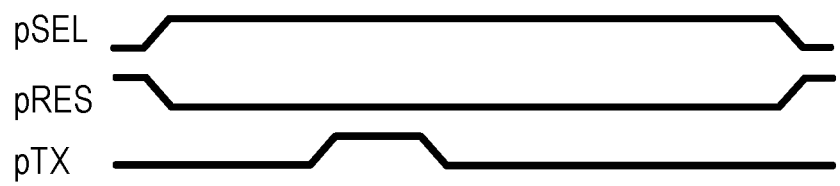
FIG. 8 is a timing diagram of drive pulses according to the first to sixth exemplary embodiments.

FIG. 8 is a timing diagram of drive pulses used to drive the image pickup apparatus according to the present exemplary embodiment. In FIG. 8, a timing diagram for the drive pulses pTX, pSEL, and pRES is illustrated.

When the reset transistors 9A and 9B are turned ON, each of the FD nodes 21A and 21B is reset to predetermined reset voltage (e.g., a voltage that is the same as the power supply voltage). The reset transistor 9A receives the reset voltage from the power supply line 2C, and the reset transistor 9B receives the reset voltage from the power supply line 2A. In addition, the selection transistors 11A and 11B select rows from which signals are delivered to the signal output lines 13A and 13B, respectively.

A light ray passes through the color filter 106 and is incident on the PDs 3A and 3B. Thus, electrons are generated through photoelectric conversion, and the generated electrons are accumulated in the PDs 3A and 3B. The electrons accumulated in the PDs 3A and 3B are transferred to the FD nodes 21A and 21B via the transfer transistors 5A and 5B, respectively. The FD nodes 21A and 21B are connected to the gates of the amplifier transistors 7A and 7B, respectively. That is, the FD nodes 21A and 21B serve as input nodes of the amplifier transistors 7A and 7B, respectively. The amplifier transistors 7A and 7B output, to the signal output lines 13A and 13B, signals in accordance with the amounts of charge transferred to the FDs, respectively. The power supply voltage that drives the amplifier transistors 7A and 7B is supplied from the power supply line 2A.

When the reset transistors 10A and 10B turn ON, each of the FD nodes 22A and 22B is reset to a predetermined reset voltage (e.g., a voltage that is the same as the power supply voltage). The reset transistor 10A receives the reset voltage from the power supply line 2A, and the reset transistor 10B receives the reset voltage from the power supply line 2B. In addition, the selection transistors 12A and 12B select rows from which signals are delivered to the signal output lines 14A and 14B, respectively.

A light ray passes through the color filter 107 and is incident on the PDs 4A and 4B. Thus, electrons are generated through photoelectric conversion, and the generated electrons are accumulated in the PDs 4A and 4B. The electrons accumulated in the PDs 4A and 4B are transferred to the FD nodes 22A and 22B via the transfer transistors 6A and 6B, respectively. The FD nodes 22A and 22B are connected to the gates of the amplifier transistors 8A and 8B, respectively. That is, the FD nodes 22A and 22B serve as input nodes of the amplifier transistors 8A and 8B, respectively. The amplifier transistors 8A and 8B output, to the signal output lines 14A and 14B, signals in accordance with the amounts of charge transferred to the FDs, respectively. The power supply voltage that drives the amplifier transistors 8A and 8B is supplied from the power supply line 2B.

Note that the need for the selection transistors may be eliminated. For example, by controlling the reset voltage supplied to the FD, a selecting operation may be performed. Alternatively, the selection transistor may be disposed in an electrical path between the power supply line and the drain of the amplifier transistor.

According to the above-described configuration, a power supply voltage may be supplied from the same power supply line to two amplifier transistors for reading signals from the photoelectric conversion units having color filters for the same color. Thus, a difference between the characteristics of two amplifier transistors may be reduced. As a result, the quality of an image may be increased.

In addition, the second conductive member of the power supply line extending in the second direction is not disposed between the photoelectric conversion units for the same color that are disposed adjacent to each other in the first direction, but is disposed between the photoelectric conversion units for different colors. Such a configuration may reduce color mixture.

Second Exemplary Embodiment

Figure 2A:
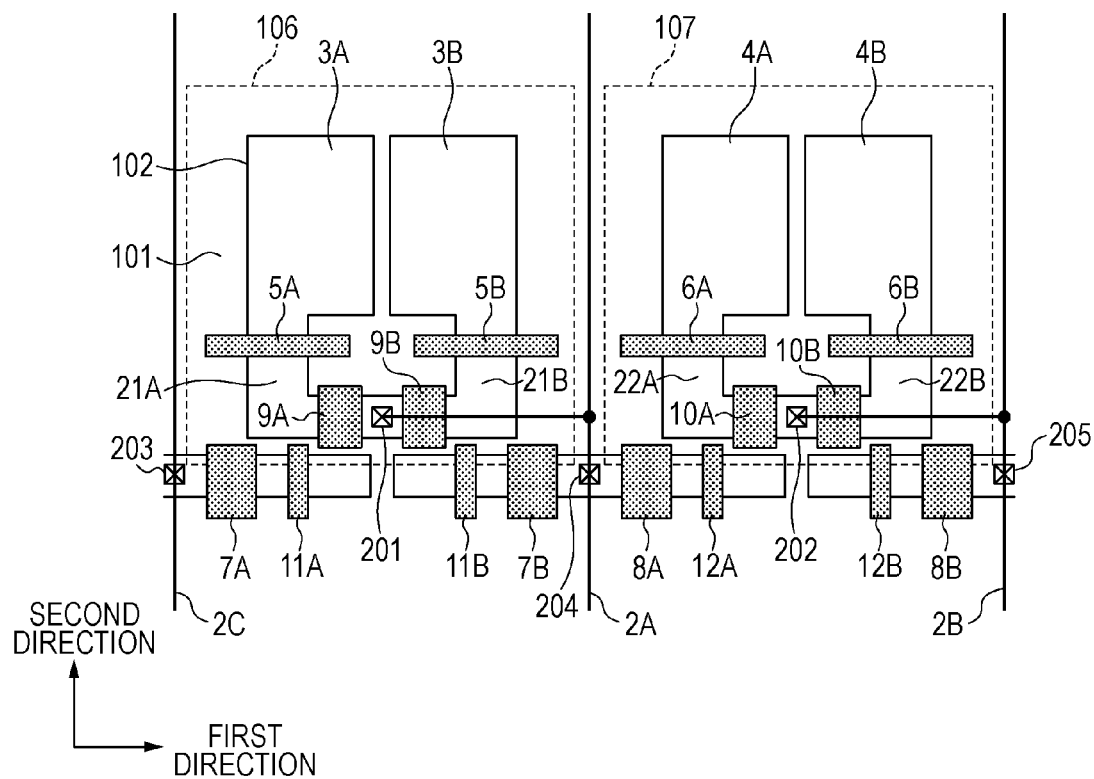
FIG. 2A is a schematic illustration of a planar layout of an image pickup apparatus according to a second exemplary embodiment.
Figure 2B:
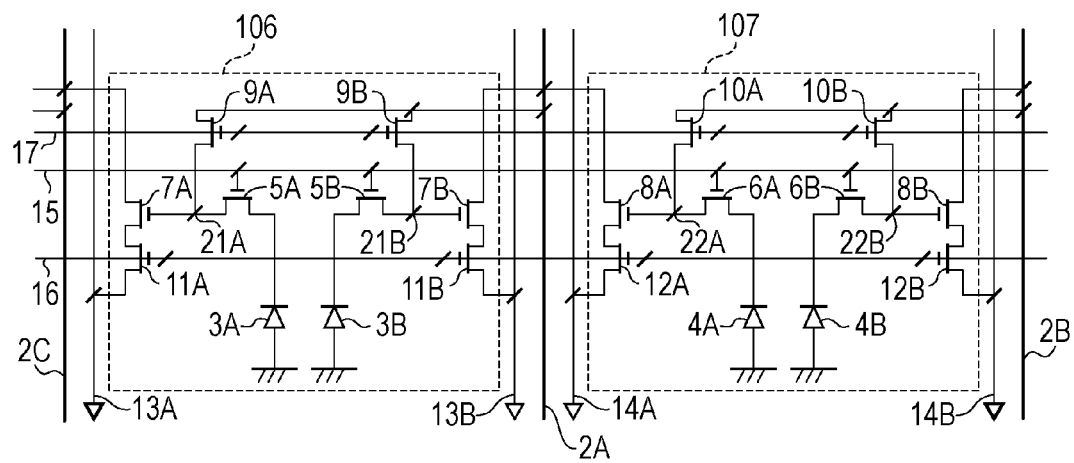
FIG. 2B is an equivalent circuit diagram of the image pickup apparatus.

A second exemplary embodiment is described below with reference to FIGS. 2A and 2B. The present exemplary embodiment differs from the first exemplary embodiment in terms of a combination of the amplifier transistors connected to the power supply lines 2A to 2C and the reset transistors. In FIGS. 2A and 2B, the same reference numerals are used for elements similar to those of the first exemplary embodiment and, thus, detailed descriptions of the elements are not repeated. In the following description, only the difference between the present exemplary embodiment and the first exemplary embodiment is described. The elements that are not described are similar to those of the first exemplary embodiment.

FIG. 2A is a schematic illustration of a planar layout of an image pickup apparatus according to the second exemplary embodiment. According to the present exemplary embodiment, the drains of the reset transistors 9A and 9B are formed from a shared semiconductor region. In addition, the drains of the reset transistors 9A and 9B are connected to the power supply line 2A via a shared contact plug 201. The drains of the reset transistors 10A and 10B are formed from a shared semiconductor region. In addition, the drains of the reset transistors 10A and 10B are connected to the power supply line 2B via a shared contact plug 202.

The drain of the amplifier transistor 7A is connected to the power supply line 2C via a contact plug 203. In contrast, the drains of the amplifier transistor 7B and the amplifier transistor 8A are formed from a shared semiconductor region. The drains of the amplifier transistor 7B and the amplifier transistor 8A are connected to the power supply line 2A via a shared contact plug 204.

According to the present exemplary embodiment, any well contact plug is not disposed in the image sensing area. However, like the first exemplary embodiment, a well contact plug may be disposed in the image sensing area. In addition, according to the present exemplary embodiment, the potential barrier between the photoelectric conversion units is formed from an insulating isolation region. However, like the first exemplary embodiment, the potential barrier between the photoelectric conversion units may be formed from a P-type semiconductor region. Furthermore, according to the present exemplary embodiment, any dark current blocking layer is not disposed between the field region 101 and the N-type semiconductor region that forms a photoelectric conversion unit. However, like the first exemplary embodiment, a P-type semiconductor region that forms the dark current blocking layer may be disposed between the field region 101 and the N-type semiconductor region that forms a photoelectric conversion unit.

FIG. 2B is an equivalent circuit diagram of the image pickup apparatus according to the present exemplary embodiment. In FIG. 2B, the same reference numerals are used for elements similar to those in FIG. 1B and, thus, detailed descriptions of the elements are not repeated.

As illustrated in FIG. 2B, the drains of two reset transistors 9A and 9B corresponding to the PDs 3A and 3B for the same color are electrically connected to the power supply line 2A. In addition, the drains of two reset transistors 10A and 10B corresponding to the PDs 4A and 4B for the same color are electrically connected to the power supply line 2B.

In contrast, the drains of the amplifier transistors 7A and 7B corresponding to the PDs 3A and 3B for the same color are connected to different power supply lines. That is, the drain of the amplifier transistor 7A is electrically connected to the power supply line 2C, and the drain of the amplifier transistor 7B is electrically connected to the power supply line 2A.

According to the above-described configuration, a power supply voltage may be supplied from the same power supply line to two amplifier transistors used to read signals from the photoelectric conversion units having color filters for the same color. Thus, a variation in the reset voltage used for a reset operation may be reduced. As a result, the quality of an image may be increased.

Third Exemplary Embodiment

Figure 3A:
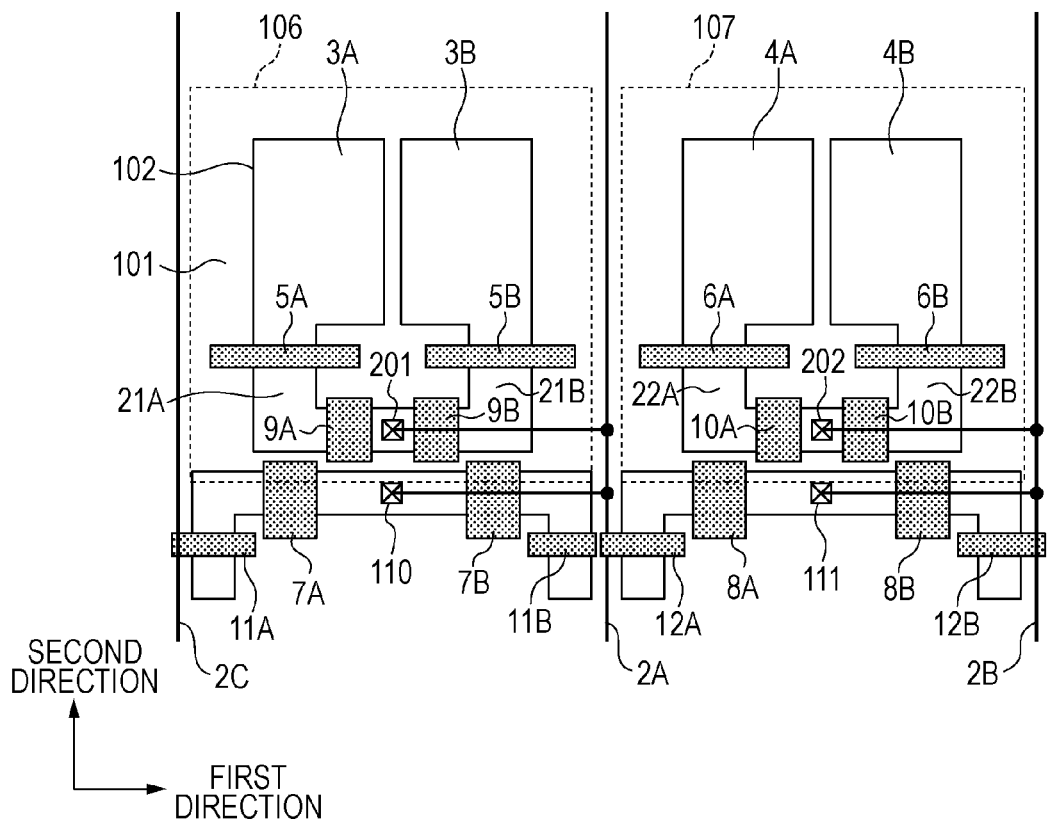
FIG. 3A is a schematic illustration of a planar layout of an image pickup apparatus according to a third exemplary embodiment.
Figure 3B:
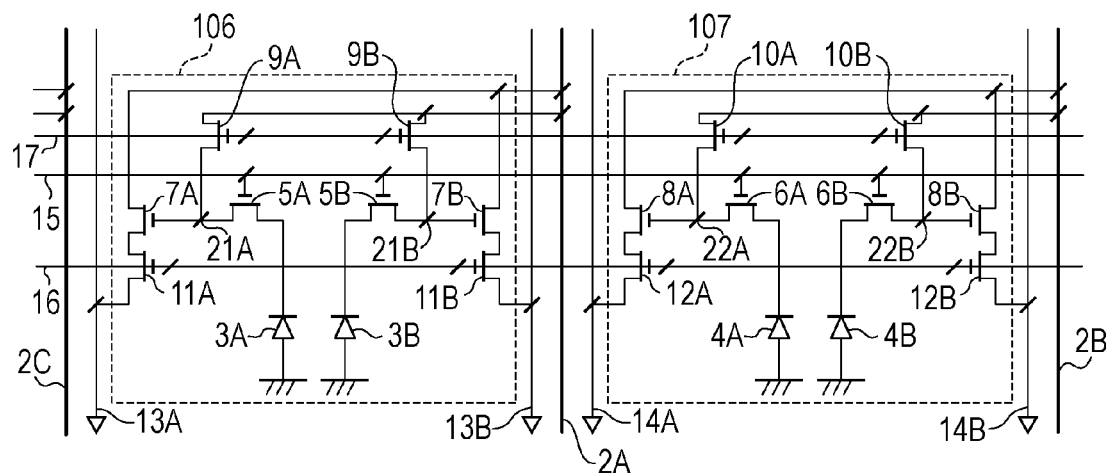
FIG. 3B is an equivalent circuit diagram of the image pickup apparatus.

A third exemplary embodiment is described below with reference to FIGS. 3A and 3B. The present exemplary embodiment differs from the first and second exemplary embodiments in terms of a combination of the amplifier transistors connected to the power supply lines 2A to 2C and the reset transistors. In FIGS. 3A and 3B, the same reference numerals are used for elements similar to those of the first or second exemplary embodiment and, thus, detailed descriptions of the elements are not repeated. The elements that are not described in the following description are similar to those of the first or second exemplary embodiment.

FIG. 3A is a schematic illustration of a planar layout of an image pickup apparatus according to the third exemplary embodiment. According to the present exemplary embodiment, the drains of the amplifier transistors 7A and 7B are formed from a shared semiconductor region. In addition, the drains of the amplifier transistors 7A and 7B are connected to the power supply line 2A via a shared contact plug 110. The drains of the amplifier transistors 8A and 8B are formed from a shared semiconductor region. In addition, the drains of the amplifier transistors 8A and 8B are connected to the power supply line 2B via a shared contact plug 111.

Furthermore, according to the present exemplary embodiment, the drains of the reset transistors 9A and 9B are formed from a shared semiconductor region. In addition, the drains of the reset transistors 9A and 9B are connected to the power supply line 2A via a shared contact plug 201. The drains of the reset transistors 10A and 10B are formed from a shared semiconductor region. In addition, the drains of the reset transistors 10A and 10B are connected to the power supply line 2B via a shared contact plug 202.

According to the present exemplary embodiment, any well contact plug is not disposed in the image sensing area. However, like the first exemplary embodiment, a well contact plug may be disposed in the image sensing area. In addition, according to the present exemplary embodiment, the potential barrier between the photoelectric conversion units is formed from an insulating isolation region. However, like the first exemplary embodiment, the potential barrier between the photoelectric conversion units may be formed from a P-type semiconductor region. Furthermore, according to the present exemplary embodiment, any dark current blocking layer is not disposed between the field region 101 and the N-type semiconductor region that forms a photoelectric conversion unit. However, like the first exemplary embodiment, a P-type semiconductor region that forms the dark current blocking layer may be disposed between the field region 101 and the N-type semiconductor region that forms a photoelectric conversion unit.

FIG. 3B is an equivalent circuit diagram of the image pickup apparatus according to the present exemplary embodiment. In FIG. 3B, the same reference numerals are used for elements similar to those in FIG. 1B and, thus, detailed descriptions of the elements are not repeated.

As illustrated in FIG. 3B, the drains of two amplifier transistors 7A and 7B corresponding to the PDs 3A and 3B for the same color are electrically connected to the power supply line 2A. In addition, the drains of two amplifier transistors 8A and 8B corresponding to the PDs 4A and 4B for the same color are electrically connected to the power supply line 2B.

Furthermore, as illustrated in FIG. 3B, the drains of two reset transistors 9A and 9B corresponding to the PDs 3A and 3B for the same color are electrically connected to the power supply line 2A. In addition, the drains of two reset transistors 10A and 10B corresponding to the PDs 4A and 4B for the same color are electrically connected to the power supply line 2B.

According to the above-described configuration, a power supply voltage may be supplied from the same power supply line to two amplifier transistors used to read signals from the photoelectric conversion units having color filters for the same color. Thus, a difference between the characteristics of the amplifier transistors may be reduced. In addition, a power supply voltage may be supplied from the same power supply line to two reset transistors used to read signals from the photoelectric conversion units having color filters for the same color. Thus, a variation in the reset voltage used for a reset operation may be reduced. As a result, the quality of an image may be increased.

Fourth Exemplary Embodiment

Figure 4:
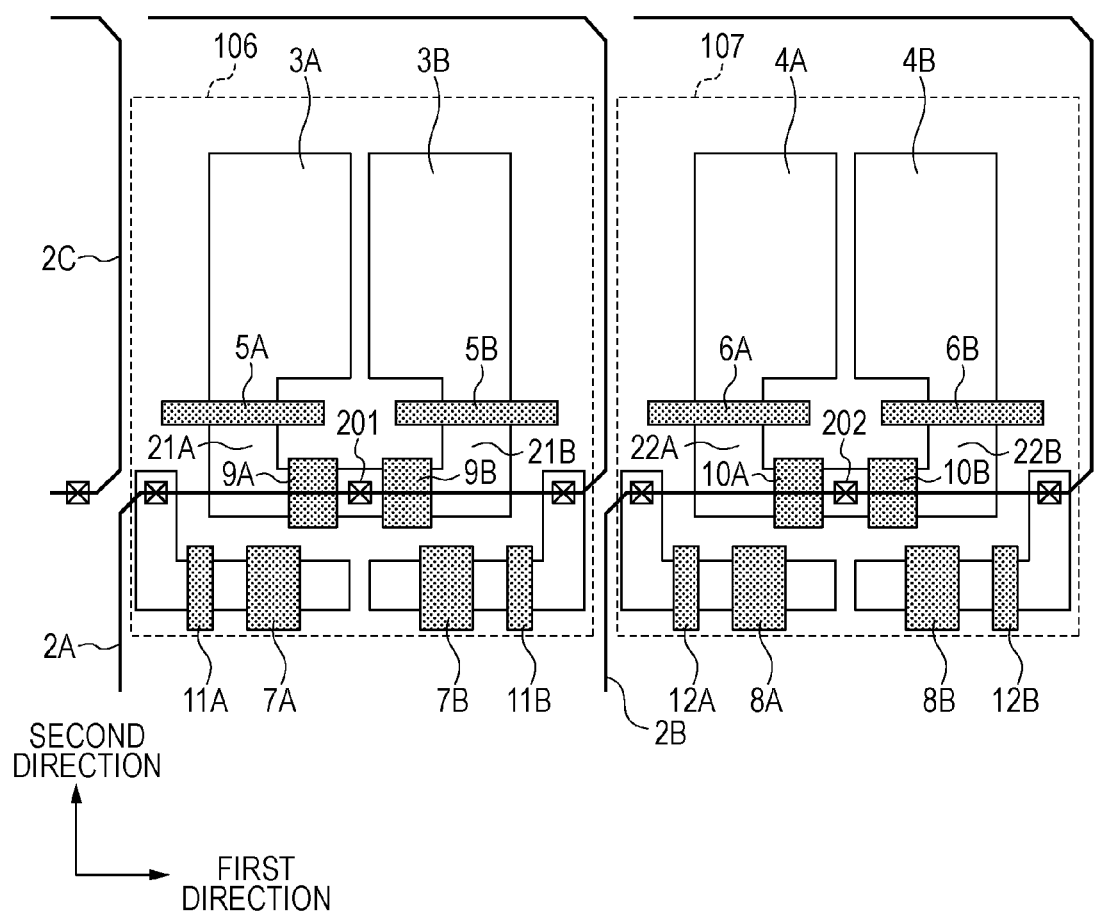
FIG. 4 is a schematic illustration of a planar layout of an image pickup apparatus according to a fourth exemplary embodiment.

A fourth exemplary embodiment is described below with reference to FIG. 4. The present exemplary embodiment differs from the first to third exemplary embodiments in terms of the layout of the power supply lines 2A to 2C. In FIG. 4, the same reference numerals are used for elements similar to those of one of the first to third exemplary embodiments and, thus, detailed descriptions of the elements are not repeated. The elements that are not described in the following description are similar to those of one of the first to third exemplary embodiments.

FIG. 4 is a schematic illustration of a planar layout of an image pickup apparatus according to the fourth exemplary embodiment. According to the present exemplary embodiment, each of the power supply lines 2A to 2C is meandering. The power supply line 2A includes second conductive members 401 and 402 each extending in the second direction. The second conductive member 401 is disposed between the PD 3B and the PD 4A. The second conductive member 402 is disposed between the PD 3A and a PD (not illustrated) located on the opposite side of the PD 3A from the PD 4A. In addition, the second conductive member 401 is connected to the second conductive member 402 via the first conductive member extending in the first direction.

According to the present exemplary embodiment, the drains of the reset transistors 9A and 9B are formed from a shared semiconductor region. In addition, the drains of the reset transistors 9A and 9B are connected to the power supply line 2A via the shared contact plug 201. In addition, the drains of the reset transistors 10A and 10B are formed from a shared semiconductor region. In addition, the drains of the reset transistors 10A and 10B are connected to the power supply line 2B via the shared contact plug 202.

Furthermore, according to the present exemplary embodiment, the selection transistors 11A and 11B are disposed in electrical paths between the power supply line 2A and the drain of the amplifier transistor 7A and between the power supply line 2A and the drain of the amplifier transistor 7B, respectively. That is, the drains of the selection transistors 11A and 11B are connected to the power supply line via the contact plugs. The sources of the selection transistors 11A and 11B and the drains of the amplifier transistors 7A and 7B are located in a shared semiconductor region. In addition, the sources of the amplifier transistors 7A and 7B are connected to signal output lines (not illustrated).

The selection transistors 12A and 12B are disposed in electrical paths between the power supply line 2B and the drain of the amplifier transistor 8A and between the power supply line 2B and the drain of the amplifier transistor 8B, respectively. That is, the drains of the selection transistors 12A and 12B are connected to the power supply line. The sources of the selection transistors 12A and 12B and the drains of the amplifier transistors 8A and 8B are located in a shared semiconductor region. In addition, the sources of the amplifier transistors 8A and 8B are connected to signal output lines (not illustrated).

According to the above-described configuration, a power supply voltage may be supplied from the same power supply line to two amplifier transistors used to read signals from the photoelectric conversion units having color filters for the same color. Thus, a difference between the characteristics of the amplifier transistors may be reduced. As a result, the quality of an image may be increased.

Even when, as in the present exemplary embodiment, the selection transistor is disposed between the drain of an amplifier transistor and a power supply line, the advantage may be provided. In addition, even when, as in the present exemplary embodiment, different semiconductor regions each having a contact plug disposed therein are connected to the same power supply line, the advantage may be provided.

Fifth Exemplary Embodiment

Figure 5:
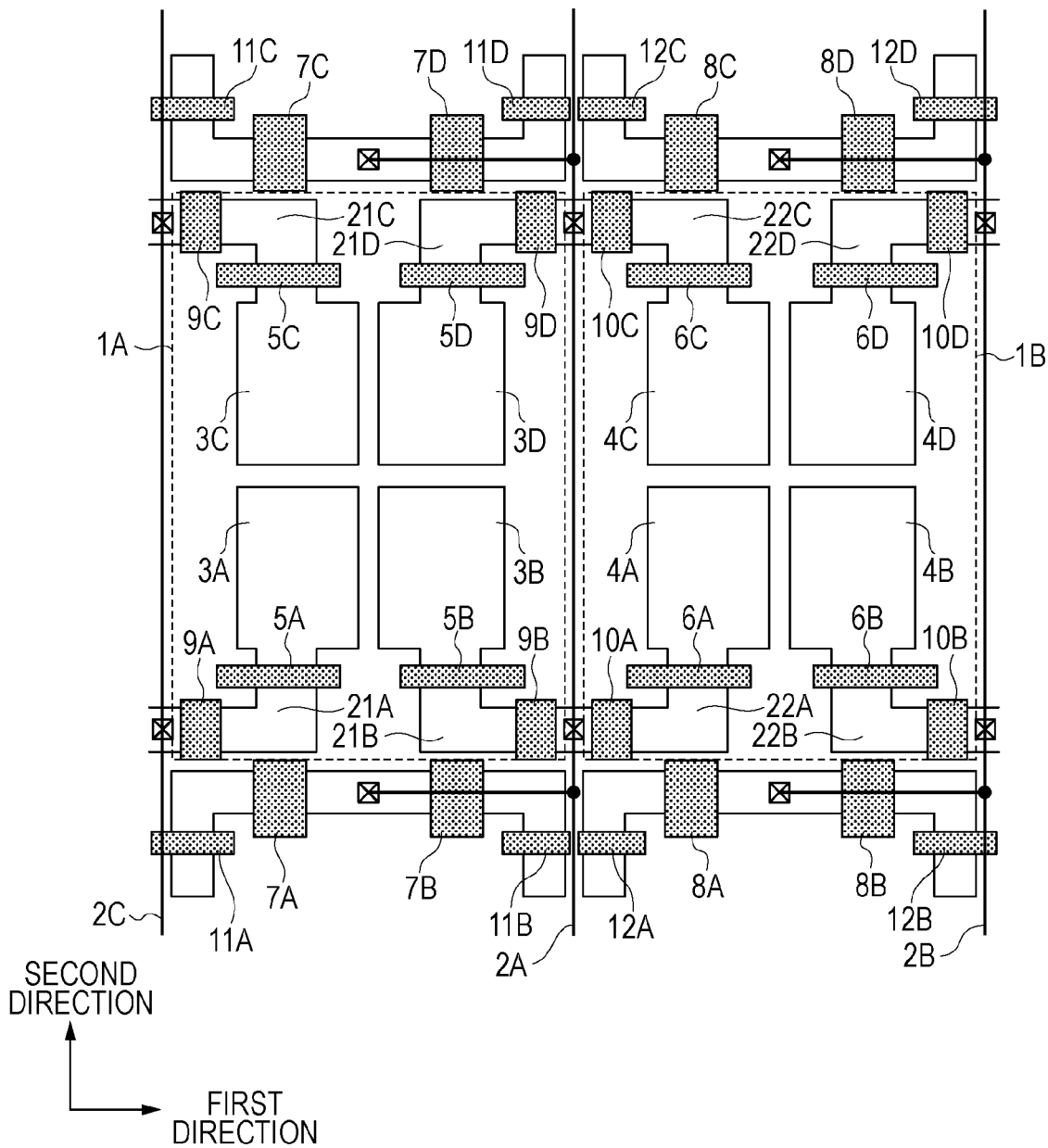
FIG. 5 is a schematic illustration of a planar layout of an image pickup apparatus according to a fifth exemplary embodiment.
Figure 6:
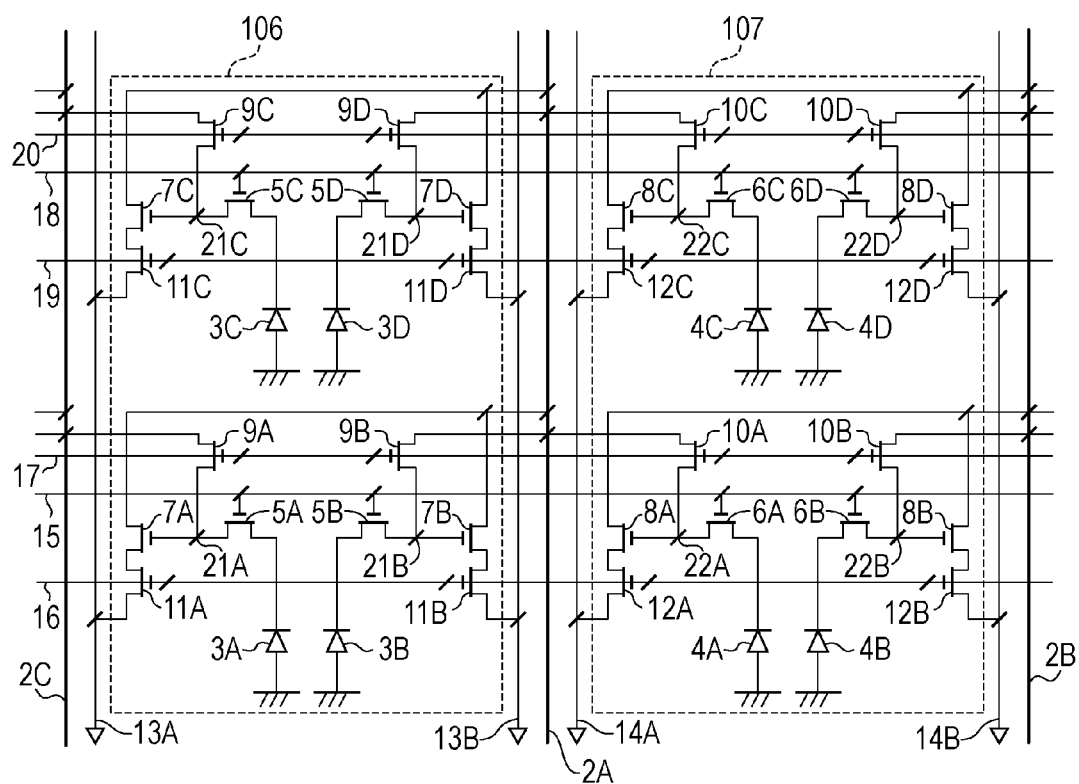
FIG. 6 is an equivalent circuit diagram of the image pickup apparatus according to the fifth exemplary embodiment.

A fifth exemplary embodiment is described below with reference to FIGS. 5 and 6. The present exemplary embodiment is characterized in that a wavelength selection unit that allows light rays in the same wavelength range to pass therethrough is disposed on four photoelectric conversion units arranged in an array with two rows and two columns. In FIGS. 5 and 6, the same reference numerals are used for elements similar to those of one of the first to fourth exemplary embodiments and, thus, detailed descriptions of the elements are not repeated. The elements that are not described in the following description are similar to those of one of the first to fourth exemplary embodiments.

According to the present exemplary embodiment, the red color filter 106 is disposed on four PDs 3A to 3D. In addition, the green color filter 107 is disposed on four PDs 4A to 4D. Accordingly, for each of the colors, four elements other than the PD are disposed. For example, the amplifier transistors 7A to 7D are disposed. As noted above, the reference symbol of each of these elements has one of alphabetic characters A to D as a suffix and, thus, detailed description is not provided.

According to the present exemplary embodiment, the drains of the amplifier transistors 7A and 7B are formed from a shared semiconductor region. The drains of the amplifier transistors 7A and 7B are connected to the power supply line 2A via a shared contact plug 501. In addition, the drains of the amplifier transistors 7C and 7D are formed from a shared semiconductor region. The drains of the amplifier transistors 7C and 7D are connected to the power supply line 2A via a shared contact plug 502.

The second conductive member of the power supply line 2A extending in the second direction is disposed between two PDs for different colors. In addition, by disposing the first conductive member of the power supply line 2A extending in the first direction, the four amplifier transistors 7A to 7D are electrically connected to the power supply line 2A.

FIG. 6 is an equivalent circuit diagram of the image pickup apparatus according to the fifth exemplary embodiment. The PDs 3A, 3B, 3C, and 3D share the color filter 106, while the PDs 4A, 4B, 4C, and 4D share the color filter 107. Transfer transistors 5C, 5D, 6C, and 6D are controlled by a control line 18. Reset transistors 9C, 9D, 10C, and 10D are controlled by a control line 20. Selection transistors 11C, 11D, 12C, and 12D are controlled by a control line 19.

By sequentially supplying drive pulses to the control lines 15 to 17 and the control lines 18 to 20, signals are read out for each of the rows. That is, by supplying the drive pulses illustrated in FIG. 8 to the control lines 18 to 20, signals are read out of the PDs 3C, 3D, 4C, and 4D. Subsequently, by supplying the drive pulses illustrated in FIG. 8 to the control lines 15 to 17, signals are read out of the PDs 3A, 3B, 4A, and 4B.

According to the above-described configuration, a power supply voltage may be supplied from the same power supply line to four amplifier transistors used to read signals from the photoelectric conversion units having color filters for the same color. Thus, a difference among the characteristics of the amplifier transistors may be reduced. As a result, the quality of an image may be increased.

In addition, the first conductive member of the power supply line extending in the first direction is not disposed between the photoelectric conversion units for the same color that are disposed adjacent to each other in the second direction, but is disposed between the photoelectric conversion units for different colors. Such a configuration may reduce color mixture.

Second Group of Embodiments

A second group of embodiments is described next with reference to FIGS. 7A and 7B. For convenience of description, in FIGS. 7A and 7B, only wire lines related to the second group of embodiments are illustrated. In reality, to operate an image pickup apparatus, a plurality of wire lines may be further disposed. For example, gate control lines of transistors and a signal output line provided to each of the rows of pixels are disposed.

According to the second group of embodiments, an image pickup apparatus includes a plurality of photoelectric conversion units arranged in a two-dimensional array. A region having the plurality of photoelectric conversion units disposed therein serves as an image sensing area. For example, a photodiode (hereinafter simply referred to as a "PD") is used as the photoelectric conversion unit. A PD includes an N-type (first conductive type) semiconductor region and a P-type (second conductive type) semiconductor region that forms a PN junction together with the N-type semiconductor region. For example, a P-type well serves as a P-type semiconductor region. Such photoelectric conversion units are arranged along a first direction. In FIGS. 7A and 7B, the first direction is the right-left direction of the page. A potential barrier is formed between the photoelectric conversion units. In addition, an isolation unit may electrically insulate the photoelectric conversion unit from an element, such as a transistor.

Note that for example, the photoelectric conversion units arranged along the first direction may be arranged so that the median points of the photoelectric conversion units are in the same straight line or the median points are staggered.

According to the present group of exemplary embodiments, the image pickup apparatus has a lens disposed therein. The lens collects light incident on the photoelectric conversion unit. A plurality of lenses may be arranged in one-dimensional or two-dimensional arrays. The plurality of the photoelectric conversion units arranged along the first direction include the photoelectric conversion units disposed under a first lens and the photoelectric conversion units disposed under a second lens that is adjacent to the first lens. Among the photoelectric conversion units disposed under the first lens, at least two photoelectric conversion units are disposed adjacent to each other. The lens collects or focuses parallel light rays incident thereon to a point. The lens is in the form of a microlens made of, for example, an organic material.

As used herein, among the photoelectric conversion units arranged in a two-dimensional array, a set of the photoelectric conversion units that outputs signals read in parallel is referred to as a "row". The plurality of photoelectric conversion units included in each of rows may be arranged along the first direction. The signals may be read out of a plurality of the photoelectric conversion units included in a row in parallel. Alternatively, the signals may be read out of a plurality of the photoelectric conversion units included in a plurality of rows in parallel. In addition, in order to read a signal output from each of photoelectric conversion units, transistors are disposed so as to correspond to each of the photoelectric conversion units. The transistors that read a signal from the photoelectric conversion unit form a pixel circuit. That is, the transistors that read a signal from the photoelectric conversion unit form a readout circuit for each of the photoelectric conversion units in an image sensing area. More specifically, the transistors that read a signal output from a photoelectric conversion unit are, for example, an amplifier transistor, a reset transistor, and a selection transistor. The photoelectric conversion unit and transistors that read a signal output from the photoelectric conversion unit may form a pixel. That is, a pixel includes a photoelectric conversion unit and a pixel circuit.

A second aspect of the embodiments is characterized in that two corresponding transistors used to read signals output from two photoelectric conversion units disposed under the first lens are electrically connected to the same power supply line. Note that the term "two corresponding transistors" refers to two transistors having the same function in the readout circuit. For example, the drains of the two amplifier transistors are electrically connected to the same power supply line.

In addition, the power supply line includes a first conductive member extending in the first direction and a second conductive member extending in a second direction that intersects the first direction. In FIGS. 7A and 7B, the second direction is an up-down direction of the page.

The second conductive member is disposed between the photoelectric conversion unit disposed under the first lens and the photoelectric conversion unit disposed under the second lens. The second conductive member extends across at least a plurality of rows. In this manner, transistors corresponding to the photoelectric conversion units included in the plurality of rows are connected to the same power supply line. That is, the transistors corresponding to a plurality of the photoelectric conversion units included in a pixel column are connected to the same power supply line. For example, as illustrated in FIGS. 7A and 7B, a power supply voltage is supplied from the same power supply line to an amplifier transistor used to read a signal output from a PD 3B and an amplifier transistor used to read a signal output from a PD (not illustrated) disposed adjacent to the PD 3B in the second direction. Preferably, the second conductive member may extend all across the image sensing area. In such a case, the transistors corresponding to all of the photoelectric conversion units arranged along the second direction, that is, the transistors corresponding to all of the photoelectric conversion units included in one pixel column may be connected to the same power supply line.

Since two photoelectric conversion units disposed under the first lens are arranged so as to be adjacent to each other in the first direction, two transistors used to read signals output from the two photoelectric conversion units are arranged along the first direction. Since the power supply line includes the first conductive member extending in the first direction, the two transistors corresponding to the two photoelectric conversion units disposed under one lens may be connected to the same power supply line.

Preferably, the first conductive member and the second conductive member are disposed in different wiring layers. However, the first conductive member and the second conductive member may be included in the same wiring layer, depending on a positional relationship with other wire lines. If the first conductive member and the second conductive member are disposed in different wiring layers, the first conductive member and the second conductive member are electrically connected to each other using a via plug. The first conductive member is extended from a position at which the via plug is disposed in the first direction. At that time, it is desirable that the first conductive member be electrically connected to the transistor using a contact plug. Depending on a layout, the transistor may be connected to the second conductive member using a contact plug.

If two transistors are connected to different power supply lines, the power supply voltages supplied to the two transistors may differ from each other. However, according to the configuration illustrated in FIGS. 7A and 7B, the power supply voltage is supplied from the same power supply line to the transistors that read signals from the photoelectric conversion units disposed under one lens. Thus, a difference between the characteristics of the transistors used to read signals may be reduced or may be completely eliminated.

By reducing a difference between the characteristics of the neighboring transistors used to read signals from two photoelectric conversion units disposed under the first lens, the accuracy of focus detection may be increased.

In particular, if the amplifier transistors are connected to the same power supply line, the effect is noticeable. This is because an electrical current flows in the amplifier transistor when the amplifier transistor operates and, therefore, a variation in the power supply voltage in accordance with a variation in the parasitic resistance of the power supply line becomes noticeable.

In addition, according to the present group of embodiments, each of the photoelectric conversion units may have a wavelength selection unit, such as a color filter. For example, by disposing a color filter that allows light in a red wavelength range to pass therethrough, the light in a red wavelength range is incident on the photoelectric conversion unit. The plurality of photoelectric conversion units arranged along the first direction include the photoelectric conversion units that receive light in a first wavelength range (e.g., a red wavelength range) and the photoelectric conversion units that receive light in a second wavelength range (e.g., a green wavelength range).

A set of the photoelectric conversion units of one color and a set of the photoelectric conversion units of the other color are alternately and repeatedly arranged. In addition, at least two photoelectric conversion units that receive light of the same color are disposed adjacent to each other. For example, two photoelectric conversion units that receive light of a red color are disposed adjacent to each other, and two photoelectric conversion units that receive light of a green color are disposed adjacent to each other next to the photoelectric conversion unit that receives the light of a red color. The arrangement of these four photoelectric conversion units is repeatedly disposed. That is, the photoelectric conversion units for red, red, green, green, red, red, green, and green colors are disposed in this order. Note that the number of the consecutive photoelectric conversion units for the same color is not limited to two. For example, two photoelectric conversion units for a red color may be disposed adjacent to each other, and one photoelectric conversion unit for a green color may be disposed next to the two photoelectric conversion units. Thereafter, the arrangement of the three photoelectric conversion units may be repeatedly disposed.

Alternatively, different color filters may be disposed for the lenses. For example, a red color filter may be disposed for a plurality of the photoelectric conversion units disposed under a first microlens 801, and a green color filter may be disposed for a plurality of the photoelectric conversion units disposed under a second microlens 802.

Exemplary embodiments of the present group of embodiments are described below with reference to the accompanying drawings. Note that in the exemplary embodiments, the first conductive type is an N type, and the second conductive type is a P type. Electrons are accumulated in the photoelectric conversion unit as signal charges. It should be appreciated that exemplary embodiments in which the first conductive type is a P type, and the second conductive type is an N type are also embraced within the scope of the embodiments. In such exemplary embodiments, holes are accumulated in the photoelectric conversion unit as signal charges. Since only the conductive types are exchanged in these exemplary embodiments, descriptions of the exemplary embodiments are not repeated. In addition, an image pickup apparatus and an image pickup system including a signal processing unit that processes a signal output from the image pickup apparatus are also embraced within the scope of the embodiments. In such a case, an existing signal processing unit may be used as the signal processing unit.

Sixth Exemplary Embodiment

A sixth exemplary embodiment is described below with reference to the accompanying drawings. In the following description, the same reference numbers are assigned to similar elements of the photoelectric conversion units disposed under one lens, but are suffixed by different alphabetic characters. For example, PDs disposed under one lens are designated as "PD 3A" and "PD 3B". Amplifier transistors that amplify signals output from the photoelectric conversion units disposed under one lens are designated as "amplifier transistors 7A and 7B".

Figure 7A:
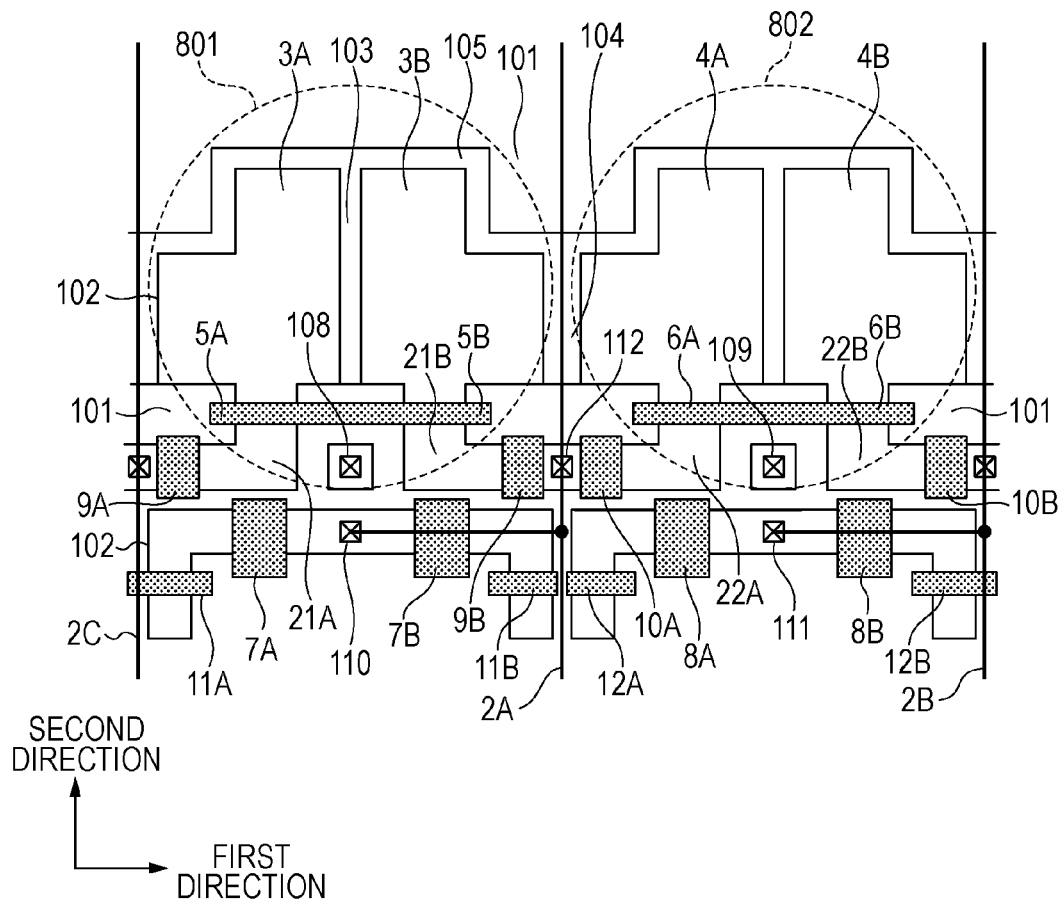
FIG. 7A is a schematic illustration of a planar layout of an image pickup apparatus according to a sixth exemplary embodiment.

FIG. 7A is a schematic illustration of a planar layout of an image pickup apparatus according to the sixth exemplary embodiment. According to the present exemplary embodiment, the image pickup apparatus includes a semiconductor substrate having a field region 101 and an active region 102. For example, the semiconductor substrate is made of silicon. The field region 101 is formed as an insulating isolation region, such as an STI or LOCOS region. The active region 102 has a semiconductor region disposed therein. The semiconductor region forms a photoelectric conversion unit and a transistor. For example, the insulator is formed from a silicon dioxide film.

The active region 102 has a PD 3A, a PD 3B, a PD 4A, and a PD 4B disposed therein. Each of the PDs includes an N-type semiconductor region. The N-type semiconductor region and a P-type semiconductor region that form a PN junction together with the N-type semiconductor region form the PD. For example, the P-type semiconductor region is formed as a dark current blocking layer disposed on the surface, a semiconductor region that forms a potential barrier, a dark current blocking layer disposed so as to be adjacent to the insulating isolation region, a channel stop layer, a well, or the semiconductor substrate. Electrons serving as signal charges are accumulated in the N-type semiconductor region that forms the PD.

The PD 3A, the PD 3B, the PD 4A, and the PD 4B are arranged along the first direction. According to the present exemplary embodiment, a plurality of the photoelectric conversion units arranged along the first direction are arranged so that the median points of the photoelectric conversion units are in the same straight line. Note that the median points of the photoelectric conversion units may be staggered.

According to the present exemplary embodiment, a plurality of microlenses are disposed. The PD 3A and the PD 3B are disposed under the first microlens 801. The PD 4A and the PD 4B are disposed under the second microlens 802. As illustrated in FIGS. 7A and 7B, two PDs disposed under one microlens are arranged adjacent to each other along the first direction. The PDs 3A and 3B receive light collected by the first microlens 801. The PDs 4A and 4B receive light collected by the second microlens 802.

According to the present exemplary embodiment, the plurality of PDs arranged along the first direction form the photoelectric conversion units in a row. That is, the PD 3A, the PD 3B, the PD 4A, and the PD 4B are included in the same row. Although not illustrated in FIG. 7A, a plurality of photoelectric conversion units included in the image pickup apparatus according to the present exemplary embodiment may form a plurality of rows.

According to the present exemplary embodiment, a potential barrier 103 may be formed from a P-type semiconductor region between the PD 3A and the PD 3B disposed under the first microlens 801. In addition, a potential barrier 104 may be formed from a P-type semiconductor region between the PD 3B and the PD 4A disposed under a different microlens. The length of the P-type semiconductor region that forms the potential barrier 104 in the first direction is longer than the length of the P-type semiconductor region that forms the potential barrier 103 in the first direction. An end of the P-type semiconductor region serves as a PN junction plane. That is, a distance between the N-type semiconductor region included in the PD 3B and the N-type semiconductor region included in the PD 4A is longer than a distance between the N-type semiconductor region included in the PD 3A and the N-type semiconductor region included in the PD 3B.

A potential barrier is formed from a region in which the potential for the signal charge accumulated in the photoelectric conversion unit is higher than the potential of the signal charges of the photoelectric conversion unit. For example, when the photoelectric conversion unit is formed from a PD including a PN junction and if the signal charges are electrons, the potential barrier is a region in which the potential for an electron is higher than the potential of the N-type semiconductor region included in the PD. Alternatively, if the signal charges are holes, the potential barrier is a region in which the potential for a hole is higher than the potential of the P-type semiconductor region included in the PD.

The potential barrier may be formed from an insulating isolation region, such as a STI, LOCOS, or MESA region. Since the band gap of an insulating material is wider than that of a semiconductor, the insulating material may function as the potential barrier for a carrier in the semiconductor (i.e., for both an electron and a hole). Alternatively, if the signal charge is an electron, the potential barrier may be formed from a P-type semiconductor region. Still alternatively, if the signal charge is a hole, the potential barrier may be formed from an N-type semiconductor region. Yet still alternatively, to form the potential barrier, an electrode may be disposed on the semiconductor substrate, and the potential barrier may be formed by a voltage supplied to the electrode. As the voltage supplied to the electrode is decreased, the potential for an electron increases. In contrast, as the voltage supplied to the electrode is increased, the potential for a hole increases. In the present exemplary embodiment and the subsequent exemplary embodiments, the words "potential barrier is disposed" include at least a condition that the potential barrier is formed using any one of the above-described techniques or a condition that the potential barrier is possibly formed using any one of the above-described configurations.

Note that a potential barrier between two photoelectric conversion units is a region sandwiched by the N-type semiconductor regions of the photoelectric conversion units. In addition, the distance from the potential barrier is a distance from an end of an insulating material that forms the potential barrier or a distance from an end of a P-type semiconductor region that forms the potential barrier.

A P-type semiconductor region 105 is disposed between the insulating isolation region that forms the field region 101 and the PD. The P-type semiconductor region 105 serves as a dark current blocking layer that reduces a dark current that is generated on the boundary face of the insulating material and that flows into the PD.

Floating diffusion regions (hereinafter simply referred to as "FD regions") 21A, 21B, 22A, and 22B that receive electrical charge from the PDs are disposed in the active region 102. In addition, transfer transistors 5A, 5B, 6A, and 6B that transfer the electrical charge of the PDs to the FD regions are provided. The FD regions are connected to amplifier transistors 7A, 7B, 8A, and 8B using wire lines (not illustrated). Each of the amplifier transistors functions as an amplifier unit that amplifies a signal generated by the PD. In addition, reset transistors 9A, 9B, 10A, and 10B and selection transistors 11A, 11B, 12A, and 12B are disposed. Each of the reset transistors resets an input node of the amplifier transistor to a predetermined voltage. Each of the selection transistors controls an electrical connection between the source of the amplifier transistor and a signal output line (not illustrated). The signal output line is disposed in the wiring layer that includes the power supply line among a plurality of the wiring layers. Each of the transistors includes a semiconductor region that forms the source or drain. The transistor further includes a gate electrode formed of polysilicon.

According to the present exemplary embodiment, well contact plugs 108 and 109 that supply a voltage to the P-type semiconductor region forming the PD are disposed. The well contact plugs 108 and 109 are formed of a conductive material, such as tungsten. The well contact plug 108 is disposed so as to be closer to the potential barrier 103 than to the potential barrier 104. In addition, the well contact plug 108 is disposed in a region that is an extension of the P-type semiconductor region that forms the potential barrier 103 in the second direction. That is, the well contact plug 108 is disposed outside the potential barrier 103. Furthermore, as illustrated in FIG. 7A, the well contact plug 108 may be disposed in the middle of the two photoelectric conversion units disposed under one microlens.

Still furthermore, the well contact plug 109 is also disposed between two PDs disposed under one microlens. In this manner, according to the present exemplary embodiment, a well contact plug is not disposed between the photoelectric conversion units disposed under different microlenses. However, in order to obtain a predetermined electrical characteristic, a well contact plug may be disposed between the photoelectric conversion units disposed under different microlenses.

According to the present exemplary embodiment, the insulating isolation region is disposed between the well contact plug 108 and the potential barrier 103 formed between two photoelectric conversion units disposed under one microlens. The insulating isolation region may reduce a dark current caused by the well contact plug 108 and reaching the photoelectric conversion unit.

According to the present exemplary embodiment, the drains of the amplifier transistors 7A and 7B are formed from a shared semiconductor region. In addition, the drains of the amplifier transistors 7A and 7B are connected to the power supply line 2A via a shared contact plug 110. In addition, the drains of the amplifier transistors 8A and 8B are formed from a shared semiconductor region. In addition, the drains of the amplifier transistors 8A and 8B are connected to the power supply line 2B via a shared contact plug 111.

The drain of the reset transistor 9A is connected to the power supply line 2C. In contrast, the drains of the reset transistor 9B and the reset transistor 10A are formed from a shared semiconductor region. In addition, the drains of the reset transistor 9B and the reset transistor 10A are connected to the power supply line 2A via the shared contact plug 111.

Each of the power supply lines 2A to 2C that supply the power supply voltage includes a first conductive member extending in the first direction and a second conductive member extending in the second direction. The first conductive member is electrically connected to the second conductive member. The first conductive member and the second conductive member may be part of a conductive pattern. Although only one pixel row is illustrated in the drawing, the second conductive member is continuously disposed in a plurality of rows. That is, a power supply voltage is supplied from the same power supply line to a plurality of transistors that read signals generated in the photoelectric conversion units arranged along the second direction. Preferably, each of the power supply lines 2A to 2C is disposed between the photoelectric conversion units for different colors in the row. Note that at that time, a combination of the colors may vary for each of the rows.

As illustrated in FIG. 7A, the second conductive member is disposed between the photoelectric conversion units disposed under different microlenses. For example, the second conductive member included in the power supply line 2A is disposed between the PD 3B and the PD 4A. The second conductive member may partially overlap the PD 3B or the PD 4A.

The first conductive member extends from a region between the photoelectric conversion units disposed under different microlenses to a region between the photoelectric conversion units disposed under one microlens. For example, the first conductive member included in the power supply line 2A extends a region between the PD 3B and the PD 4A to a region between the PD 3A and the PD 3B. In this manner, the semiconductor region that forms the drain of the amplifier transistor disposed between the PD 3A and the PD 3B is electrically connected to the power supply line 2A via the shared contact plug 110. That is, two amplifier transistors 7A and 7B corresponding to the two photoelectric conversion units disposed under one microlens are electrically connected to the power supply line 2A.

According to the present exemplary embodiment, different color filters are disposed for the microlens. The photoelectric conversion units disposed under one microlens have the same color filter disposed therefor. For example, a red color filter is disposed for the PD 3A and the PD 3B. A green color filter is disposed for the PD 4A and the PD 4B.

Alternatively, the image pickup apparatus according to the present exemplary embodiment may be a monochrome image pickup apparatus. That is, the need for the wavelength selection unit, such as a color filter, may be eliminated, or a wavelength selection unit that detects light rays in the same wavelength range for all of pixels may be disposed.

Figure 7B:
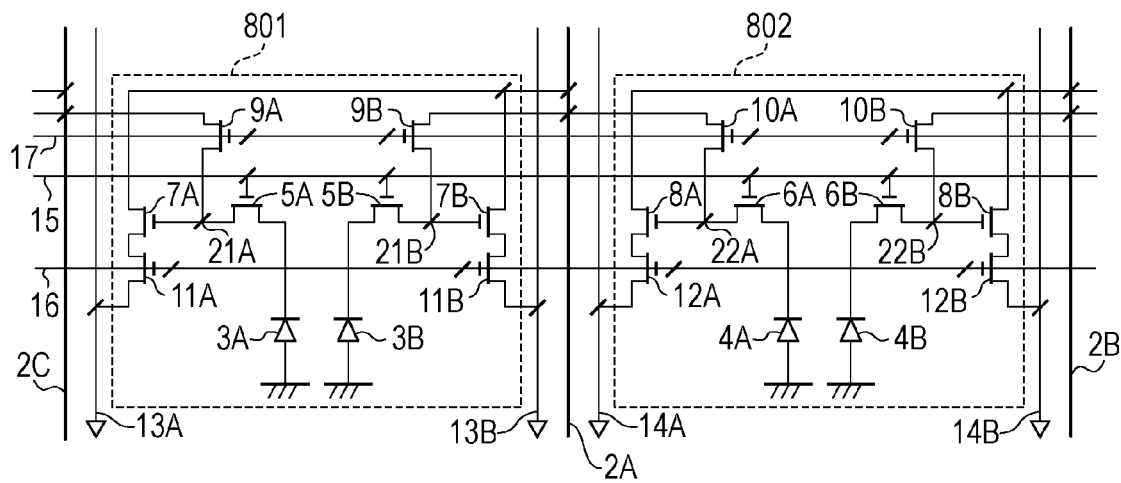
FIG. 7B is an equivalent circuit diagram of the image pickup apparatus.

FIG. 7B is an equivalent circuit diagram of the image pickup apparatus according to the present exemplary embodiment. In FIG. 7B, the following components are illustrated: the PDs 3A, 3B, 4A, and 4B, the transfer transistors 5A, 5B, 6A, and 6B, FD nodes 21A, 21B, 22A, and 22B, the amplifier transistors 7A, 7B, 8A, and 8B, the reset transistors 9A, 9B, 10A, and 10B, and the selection transistors 11A, 11B, 12A, and 12B. In addition, signal output lines 13A, 13B, 14A, and 14B that output signals generated by the PDs are illustrated. The transfer transistors 5A, 5B, 6A, and 6B are controlled by a drive pulse pTX supplied to a control line 15. The reset transistors 9A, 9B, 10A, and 10B are controlled by a drive pulse pRES supplied to a control line 17. The selection transistors 11A, 11B, 12A, and 12B are controlled by a drive pulse pSEL supplied to a control line 16.

As illustrated in FIG. 7B, the drains of the amplifier transistors 7A and 7B corresponding to the PDs 3A and 3B disposed under the microlens 801, respectively, are electrically connected to the power supply line 2A. In addition, the drains of the amplifier transistors 8A and 8B corresponding to the PDs 4A and 4B disposed under the microlens 802, respectively, are electrically connected to the power supply line 2B.

In contrast, the drains of the reset transistors 9A and 9B corresponding to the PDs 3A and 3B disposed under the microlens 801, respectively, are connected to different power supply lines. The drain of the reset transistor 9A is electrically connected to the power supply line 2C, and the drain of the reset transistor 9B is electrically connected to the power supply line 2A.

Note that for convenience of description, in FIG. 7B, three power supply lines 2A to 2C are illustrated. The power supply lines 2A to 2C may be wire lines that supply the same power supply voltages.

FIG. 8 is a timing diagram of drive pulses used to drive the image pickup apparatus according to the present exemplary embodiment. In FIG. 8, a timing diagram for the drive pulses pTX, pSEL, and pRES is illustrated.

When the reset transistors 9A and 9B are turned ON, each of the FD nodes 21A and 21B is reset to predetermined reset voltage (e.g., a voltage that is the same as the power supply voltage). The reset transistor 9A receives the reset voltage from the power supply line 2C, and the reset transistor 9B receives the reset voltage from the power supply line 2A. In addition, the selection transistors 11A and 11B select rows from which signals are delivered to the signal output lines 13A and 13B, respectively.

A light ray passes through the microlens 801 and is incident on the PDs 3A and 3B. Thus, electrons are generated through photoelectric conversion and are accumulated in the PDs 3A and 3B. The electrons accumulated in the PDs 3A and 3B are transferred to the FD nodes 21A and 21B via the transfer transistors 5A and 5B, respectively. The FD nodes 21A and 21B are connected to the gates of the amplifier transistors 7A and 7B, respectively. That is, the FD nodes 21A and 21B serve as input nodes of the amplifier transistors 7A and 7B, respectively. The amplifier transistors 7A and 7B output, to the signal output lines 13A and 13B, signals in accordance with the amounts of charge transferred to the FDs, respectively. The power supply voltage that drives the amplifier transistors 7A and 7B is supplied from the power supply line 2A.

When the reset transistors 10A and 10B turn ON, each of the FD nodes 22A and 22B is reset to a predetermined reset voltage (e.g., a voltage that is the same as the power supply voltage). The reset transistor 10A receives the reset voltage from the power supply line 2A, and the reset transistor 10B receives the reset voltage from the power supply line 2B. In addition, the selection transistors 12A and 12B select rows from which signals are delivered to the signal output lines 14A and 14B, respectively.

A light ray passes through the microlens 802 and is incident on the PDs 4A and 4B. Thus, electrons are generated through photoelectric conversion and are accumulated in the PDs 4A and 4B. The electrons accumulated in the PDs 4A and 4B are transferred to the FD nodes 22A and 22B via the transfer transistors 6A and 6B, respectively. The FD nodes 22A and 22B are connected to the gates of the amplifier transistors 8A and 8B, respectively. That is, the FD nodes 22A and 22B serve as input nodes of the amplifier transistors 8A and 8B, respectively. The amplifier transistors 8A and 8B output, to the signal output lines 14A and 14B, signals in accordance with the amounts of charge transferred to the FDs, respectively. The power supply voltage that drives the amplifier transistors 8A and 8B is supplied from the power supply line 2B.

According to the present exemplary embodiment, since two photoelectric conversion units are disposed under one microlens, both image capturing and focus detection may be performed. A light ray collected by the microlens 801 separates into two, which are incident on the PDs 3A and 3B. In each of the PDs 3A and 3B, electrical charge is generated in accordance with the amount of the incident light ray and is accumulated. Accordingly, as described above, by independently reading signals output from the PDs 3A and 3B and performing a predetermined signal process on each of the read signals, focus detection may be performed using the phase difference. In addition, by adding the output signals, a normal image capturing operation may be performed.

Note that the need for the selection transistor may be eliminated. For example, by controlling a reset voltage supplied to the FD, a selection operation may be performed. Alternatively, the selection transistor may be disposed in an electrical path between the power supply line and the drain of the amplifier transistor.

According to the above-described configuration, a power supply voltage may be supplied from the same power supply line to two amplifier transistors used to read signals from the two photoelectric conversion units disposed under one microlens. Thus, a difference between the characteristics of two amplifier transistors may be reduced. As a result, the accuracy of focus detection may be increased.

Modification of Sixth Embodiment

Configurations obtained by integrating the configuration of the sixth exemplary embodiment with each of the second to fifth exemplary embodiments are also included in the present group of embodiments. In the second to fifth exemplary embodiments of such exemplary embodiments, a microlens is disposed for a plurality of photoelectric conversion units for the same color instead of a color filter. For example, in FIGS. 2A and 2B, FIGS. 3A and 3B, and FIG. 4, the PDs 3A and 3B are disposed under a first microlens, and the PDs 4A and 4B are disposed under a second microlens. In addition, in FIGS. 5 and 6, the PDs 3A, 3B, 3C, and 3D are disposed under a first microlens, and the PDs 4A, 4B, 4C, and 4D are disposed under a second microlens. In such a case, a configuration including the color filters 106 and 107 may be employed, or a configuration not including the color filters 106 and 107 may be employed.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-008202 filed Jan. 18, 2012, which is hereby incorporated by reference herein in its entirety.

What is claimed is:

1. An image pickup apparatus comprising:
a plurality of photoelectric conversion units; and
a power supply line configured to supply a power supply voltage,
wherein the plurality of the photoelectric conversion units include first and second photoelectric conversion units configured to receive incident light having a wavelength in a first wavelength range and a third photoelectric conversion unit configured to receive incident light having a wavelength in a second wavelength range,
wherein the first, second, and third photoelectric conversion units are arranged along a first direction so that the first photoelectric conversion unit is adjacent to the second photoelectric conversion unit, and the second photoelectric conversion unit is adjacent to the third photoelectric conversion unit,
wherein the power supply line includes a first conductive member disposed along the first direction and a second conductive member disposed along a second direction that intersects the first direction,
wherein the second conductive member is disposed on a region between the second photoelectric conversion unit and the third photoelectric conversion unit,
wherein a first transistor corresponding to the first photoelectric conversion unit and a second transistor corresponding to the second photoelectric conversion unit are electrically connected to the power supply line,
wherein the plurality of the photoelectric conversion units include a fourth photoelectric conversion unit disposed adjacent to the second photoelectric conversion unit in the second direction, and
wherein a third transistor corresponding to the fourth photoelectric conversion unit is connected to the power supply line.

2. The image pickup apparatus according to claim 1,
wherein the first transistor is a first amplifier transistor configured to output a signal based on electrical charge of the first photoelectric conversion unit,
wherein the second transistor is a second amplifier transistor configured to output a signal based on electrical charge of the second photoelectric conversion unit, and
wherein drains of the first amplifier transistor and the second amplifier transistor are electrically connected to the power supply line.

3. The image pickup apparatus according to claim 1, further comprising:
a first amplifier transistor configured to output a signal based on electrical charge of the first photoelectric conversion unit; and
a second amplifier transistor configured to output a signal based on electrical charge of the second photoelectric conversion unit,
wherein the first transistor is a first reset transistor configured to reset a voltage of an input node of the first amplifier transistor, and the second transistor is a second reset transistor configured to reset a voltage of an input node of the second amplifier transistor, and
wherein a drain of the first reset transistor and a drain of the second reset transistor are electrically connected to the power supply line.

4. The image pickup apparatus according to claim 1,
wherein the first transistor is a first selection transistor configured to select the first photoelectric conversion unit out of the plurality of the photoelectric conversion units,
wherein the second transistor is a second selection transistor configured to select the second photoelectric conversion unit out of the plurality of the photoelectric conversion units, and
wherein a drain of the first selection transistor and a drain of the second selection transistor are electrically connected to the power supply line.

5. The image pickup apparatus according to claim 1,
wherein a drain of the first transistor and a drain of the second transistor are formed from a common semiconductor region thereof, and
wherein the common semiconductor region is electrically connected to the power supply line via a contact plug.

6. The image pickup apparatus according to claim 2, further comprising:
a third amplifier transistor configured to output a signal based on electrical charge of the third photoelectric conversion unit;
a second reset transistor configured to reset a gate voltage of the second amplifier transistor; and
a third reset transistor configured to reset a gate voltage of the third amplifier transistor,
wherein the drain of the first amplifier transistor and the drain of the second amplifier transistor are connected to the power supply line via a first common contact plug thereof, and
wherein the second reset transistor and the third reset transistor are connected to the power supply line via a second common contact plug thereof.

7. The image pickup apparatus according to claim 1, further comprising:
a plurality of output lines configured to output signals of the plurality of the photoelectric conversion units,
wherein each of the plurality of the output lines is disposed along the second direction, and
wherein the second conductive member of the power supply line and the plurality of the output lines are disposed in a same wiring layer.

8. The image pickup apparatus according to claim 1, further comprising:
a plurality of wiring layers,
wherein the first conductive member and the second conductive member are disposed in different wiring layers, and
wherein the first conductive member is connected to the second conductive member via a via plug.

9. The image pickup apparatus according to claim 1, further comprising:
a contact plug,
wherein each of the photoelectric conversion units includes a first semiconductor region of a first conductive type configured to accumulate signal charges and a second semiconductor region of a second conductive type disposed so as to be in contact with the first semiconductor region of the first conductive type, wherein a first potential barrier is formed between the first photoelectric conversion unit and the second photoelectric conversion unit, and a second potential barrier is formed between the second photoelectric conversion unit and the third photoelectric conversion unit, wherein the contact plug is connected to the second semiconductor region and configured to supply a voltage to the second semiconductor region of the second conductive type, and wherein a distance between the contact plug and the first potential barrier is less than a distance between the contact plug and the second potential barrier.

10. The image pickup apparatus according to claim 1, further comprising:

a contact plug, wherein each of the photoelectric conversion units includes a first semiconductor region of a first conductive type configured to accumulate signal charges and a second semiconductor region of a second conductive type disposed so as to be in contact with the first semiconductor region of the first conductive type, wherein the contact plug is connected to the second semiconductor region and configured to supply a voltage to the second semiconductor region of the second conductive type, and wherein each of a first distance between the contact plug and the first photoelectric conversion unit and a second distance between the contact plug and the second photoelectric conversion unit is less than a third distance between the contact plug and the third photoelectric conversion unit.

11. An image pickup apparatus comprising:

a plurality of photoelectric conversion units; and a power supply line configured to supply a power supply voltage, wherein the plurality of the photoelectric conversion units include first and second photoelectric conversion units disposed under a first lens and a third photoelectric conversion unit disposed under a second lens, wherein the first, second, and third photoelectric conversion units are arranged along a first direction so that the first photoelectric conversion unit is adjacent to the second photoelectric conversion unit, and the second photoelectric conversion unit is adjacent to the third photoelectric conversion unit, wherein the power supply line includes a first conductive member disposed along the first direction and the second conductive member disposed along a second direction that intersects the first direction, wherein the second conductive member is disposed on a region between the second photoelectric conversion unit and the third photoelectric conversion unit, wherein a first transistor corresponding to the first photoelectric conversion unit and a second transistor corresponding to the second photoelectric conversion unit are electrically connected to the power supply line, wherein the plurality of the photoelectric conversion units include a fourth photoelectric conversion unit disposed adjacent to the second photoelectric conversion unit in the second direction, and wherein a third transistor corresponding to the fourth photoelectric conversion unit is connected to the power supply line.

12. An image pickup system comprising:

the image pickup apparatus according to claim 1; and a signal processing unit configured to process a signal output from the image pickup apparatus.

13. An image pickup system comprising:

the pickup apparatus according to claim 11; and a signal processing unit configured to process a signal output from the image pickup apparatus.

* * * * *